(12) United States Patent
Shibata

(10) Patent No.: US 8,837,213 B2
(45) Date of Patent: Sep. 16, 2014

(54) SEMICONDUCTOR MEMORY DEVICE WHICH STORES MULTILEVEL DATA

(71) Applicant: Kabushiki Kaisha Toshiba, Tokyo (JP)

(72) Inventor: Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/836,914

(22) Filed: Mar. 15, 2013

(65) Prior Publication Data

US 2013/0286730 A1   Oct. 31, 2013

(30) Foreign Application Priority Data

Apr. 27, 2012   (JP) ................. 2012-103645

(51) Int. Cl.
  *G11C 16/04*   (2006.01)
  *G11C 16/12*   (2006.01)
  *G11C 16/26*   (2006.01)
  *G11C 11/56*   (2006.01)

(52) U.S. Cl.
  CPC ............... *G11C 16/12* (2013.01); *G11C 16/26* (2013.01); *G11C 11/5628* (2013.01); *G11C 11/5642* (2013.01); *G11C 16/0483* (2013.01); *G11C 2211/5621* (2013.01); *G11C 2216/14* (2013.01); *G11C 2211/5646* (2013.01); *G11C 2211/5642* (2013.01)
  USPC ..................................... 365/185.02

(58) Field of Classification Search
  CPC .... G11C 16/12; G11C 16/26; G11C 11/5628; G11C 11/5642; G11C 16/0483; G11C 2211/5642; G11C 2211/5621; G11C 2216/14; G11C 2211/5646
  See application file for complete search history.

(56) References Cited

U.S. PATENT DOCUMENTS

| | | | | |
|---|---|---|---|---|
| 7,239,556 B2 * | 7/2007 | Abe et al. | ................. | 365/185.33 |
| 7,292,474 B2 * | 11/2007 | Iino et al. | ................. | 365/185.03 |
| 7,349,249 B2 * | 3/2008 | Honma et al. | ........... | 365/185.03 |
| 7,630,261 B2 * | 12/2009 | Abe et al. | .................... | 365/210.1 |
| 8,482,976 B2 * | 7/2013 | Shibata | ..................... | 365/185.03 |
| 2005/0169057 A1 | 8/2005 | Shibata et al. | | |
| 2007/0180219 A1 | 8/2007 | Iino et al. | | |
| 2009/0003058 A1 * | 1/2009 | Kang | ....................... | 365/185.03 |
| 2010/0142270 A1 | 6/2010 | Shibata | | |

FOREIGN PATENT DOCUMENTS

| | | |
|---|---|---|
| JP | 2005-243205 A | 9/2005 |
| JP | 2011-138607 A | 7/2011 |

\* cited by examiner

*Primary Examiner* — Gene Auduong

(74) *Attorney, Agent, or Firm* — Holtz Holtz Goodman & Chick PC

(57) ABSTRACT

According to one embodiment, a semiconductor memory device includes a memory cell, a flag memory cell for a flag, a dummy cell and a controller. The flag memory cell is selected at the same time as the memory cell. The dummy cell is selected at the same time as the memory cell and the flag memory cell. The controller controls write and read of the memory cell, the flag memory cell and the dummy cell. Data is written also in the dummy cell which neighbors the flag cell.

18 Claims, 14 Drawing Sheets

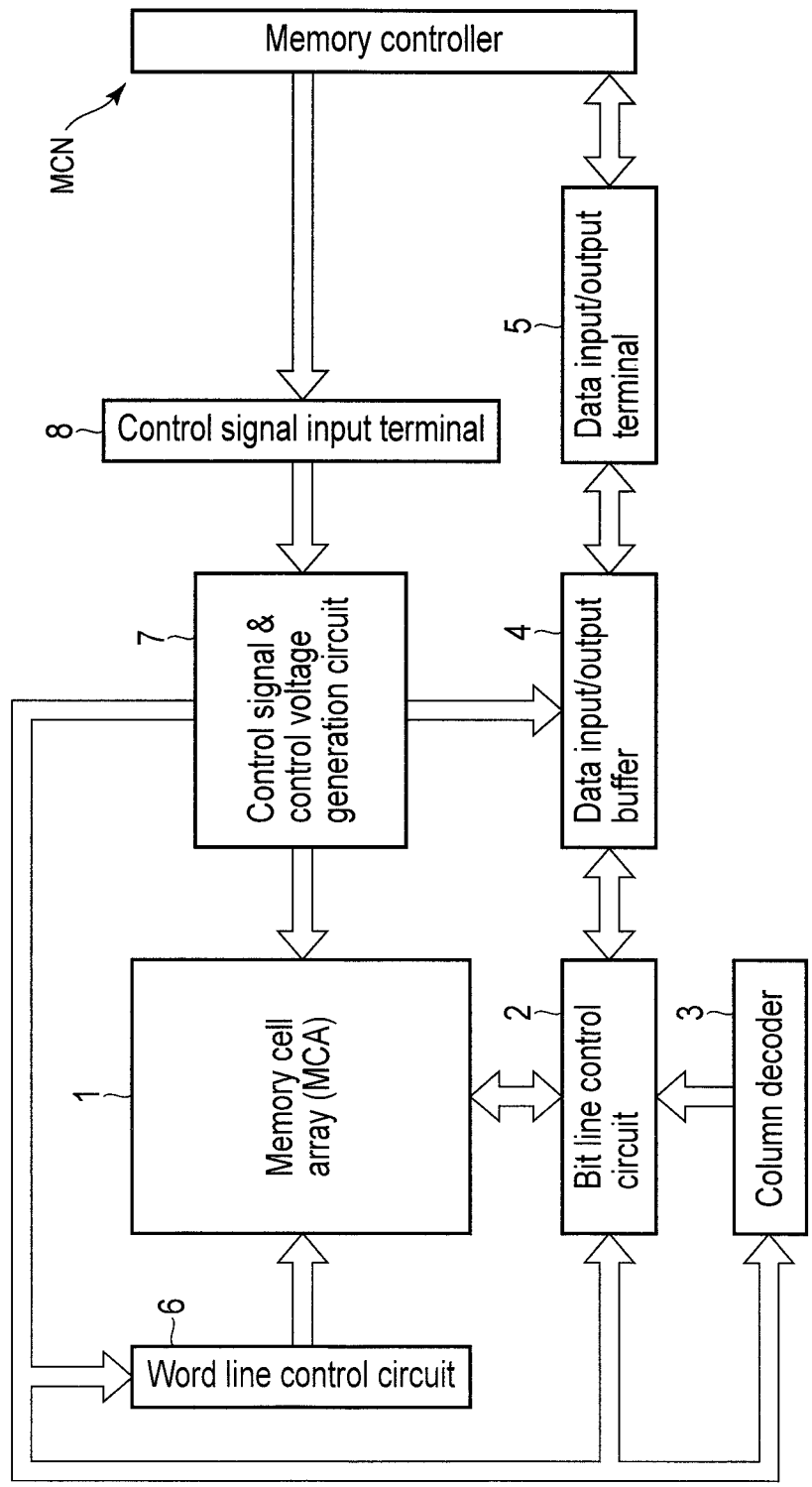
F I G. 1

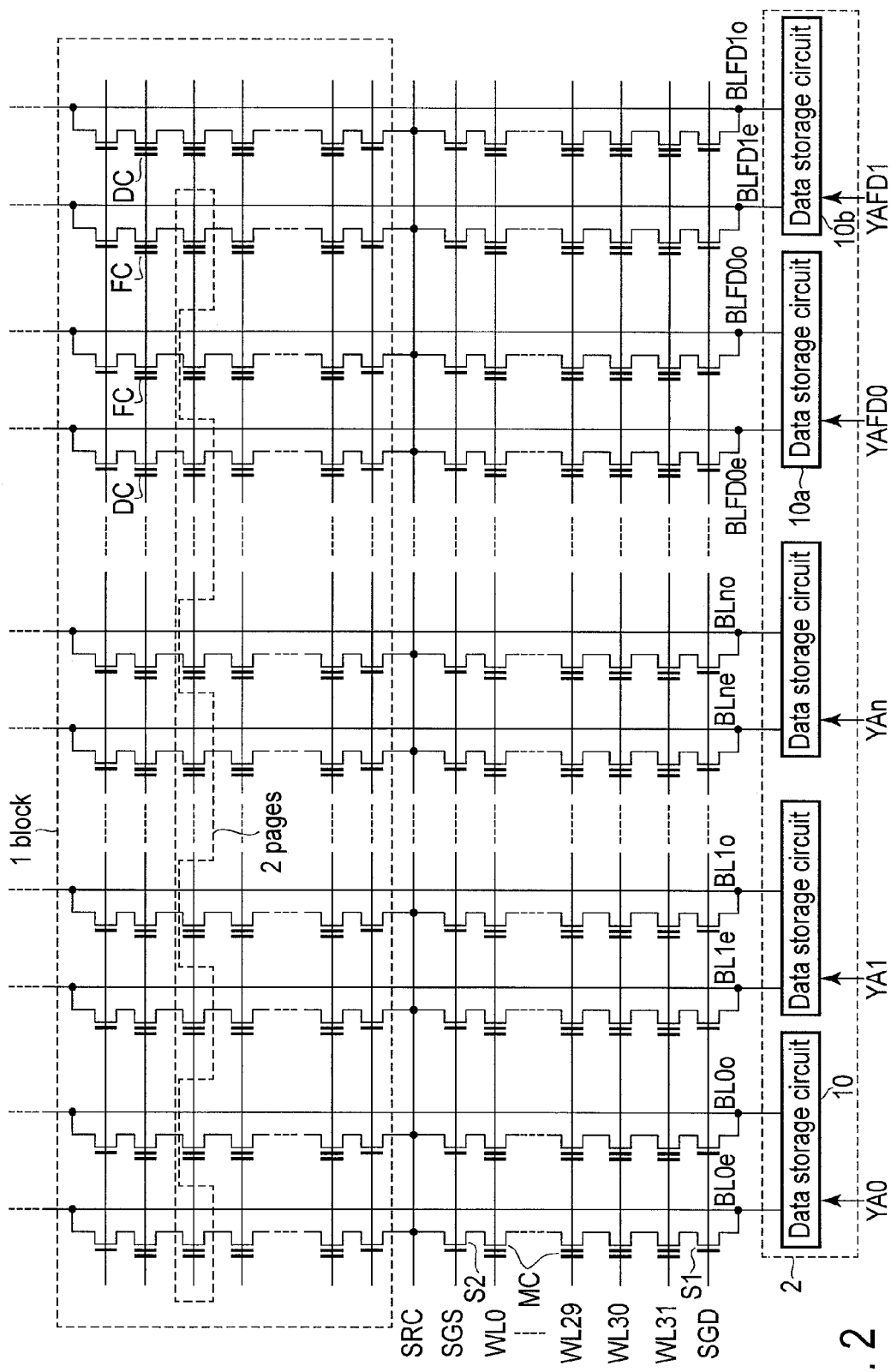
F I G. 2

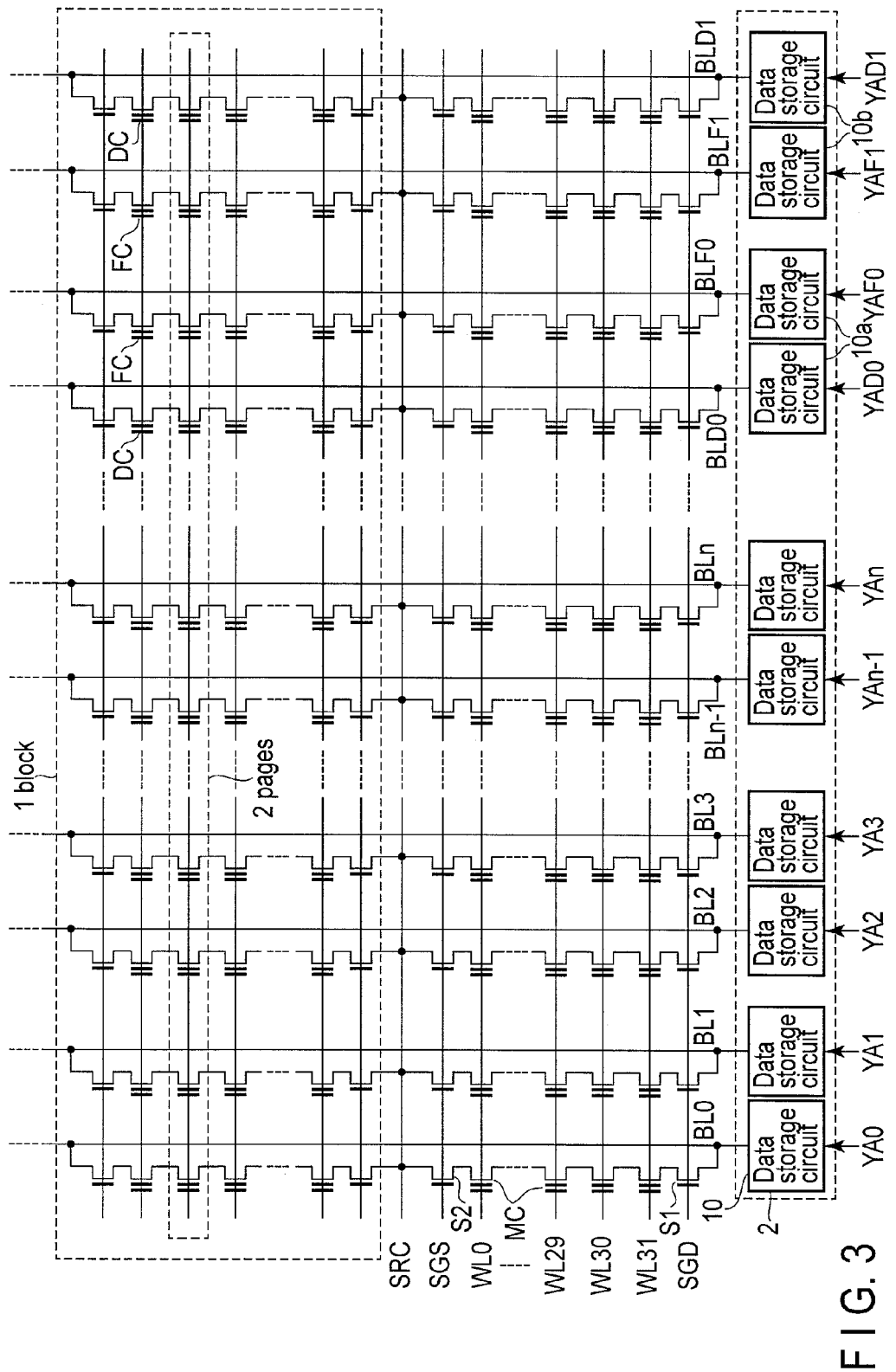
F I G. 3

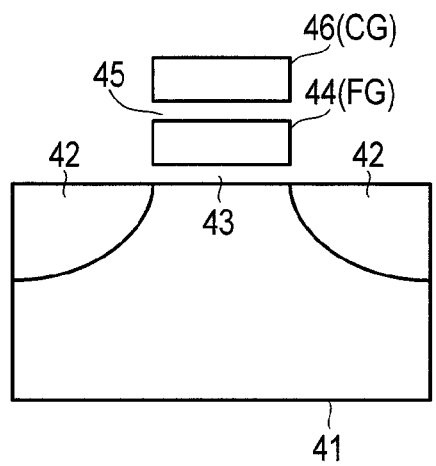 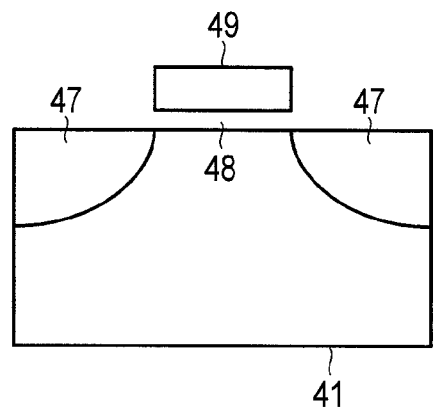
FIG. 4A    FIG. 4B
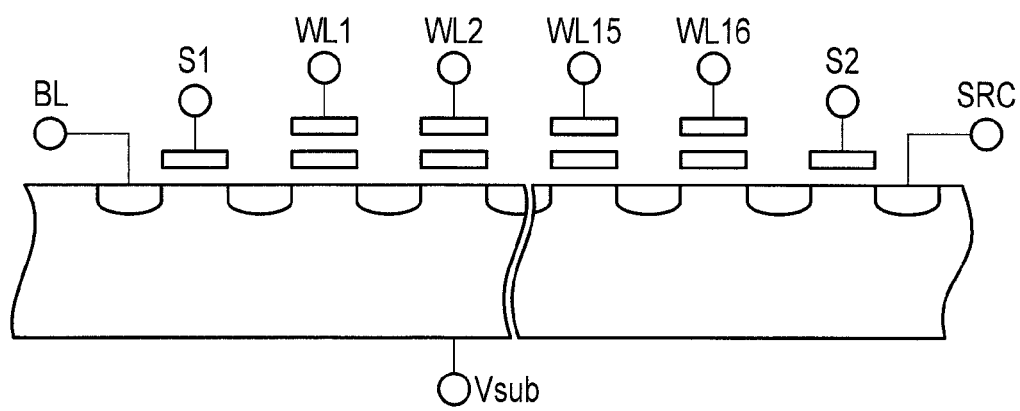
FIG. 5

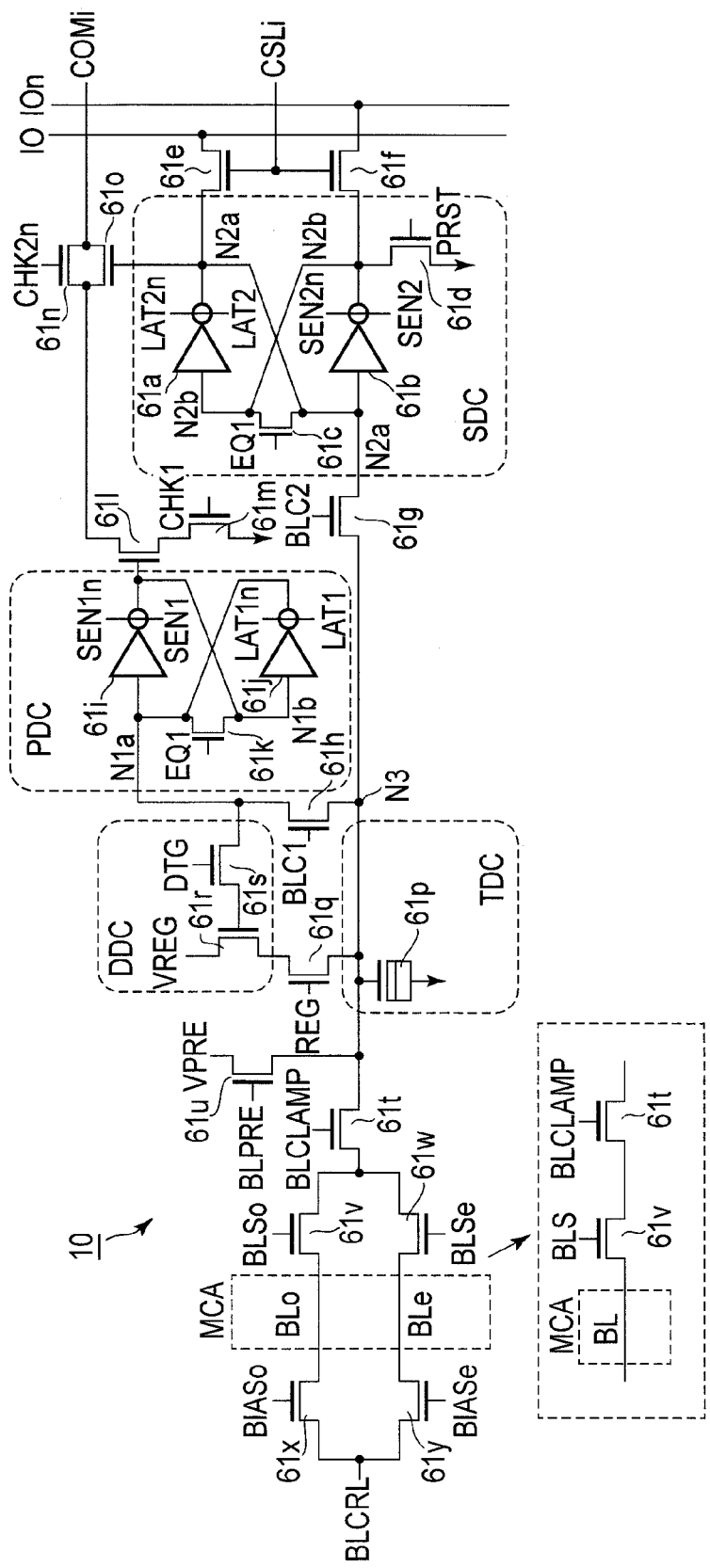
F I G. 6

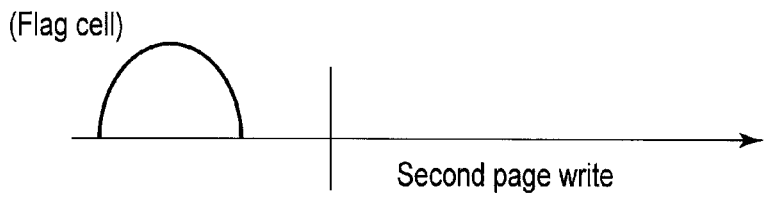
F I G. 1 2 A (Flag cell)
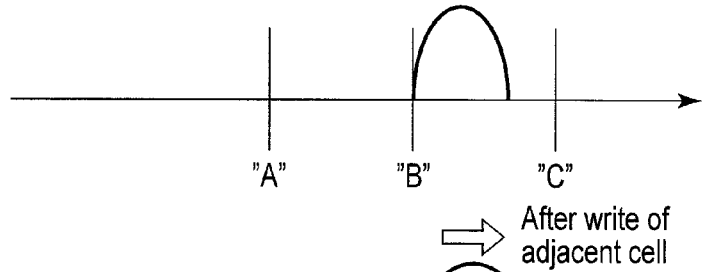
F I G. 1 2 B
"A"  "B"  "C"
⇒ After write of adjacent cell
F I G. 1 2 C
"A"  "B"  "C"
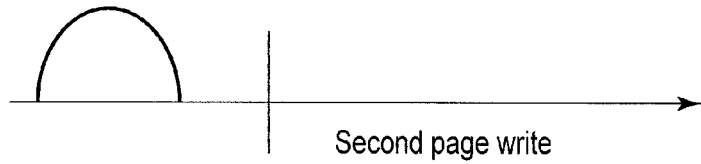
F I G. 1 3 A (Dummy cell)
Second page write
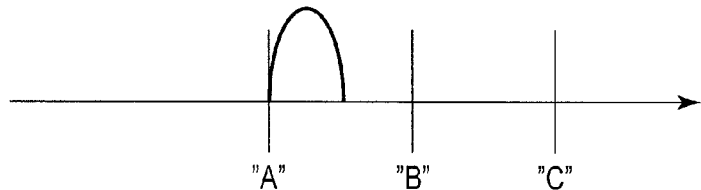
F I G. 1 3 B
"A"  "B"  "C"
⇒ After write of adjacent cell
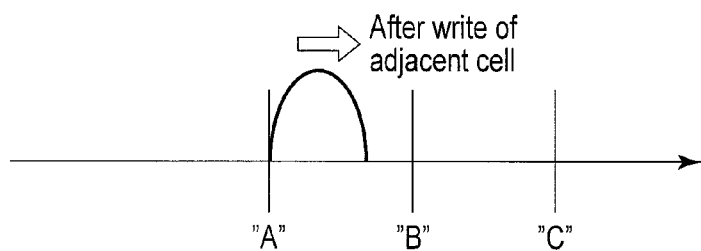
F I G. 1 3 C
"A"  "B"  "C"

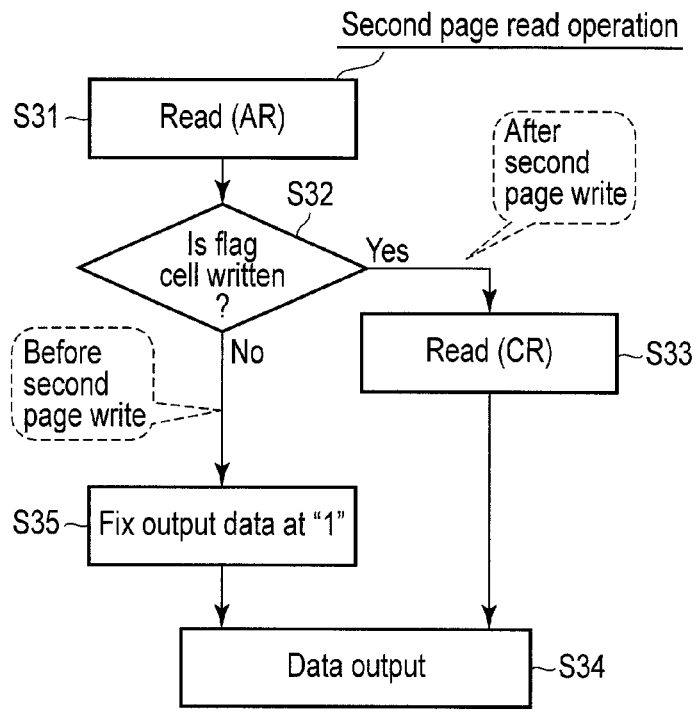
F I G. 14
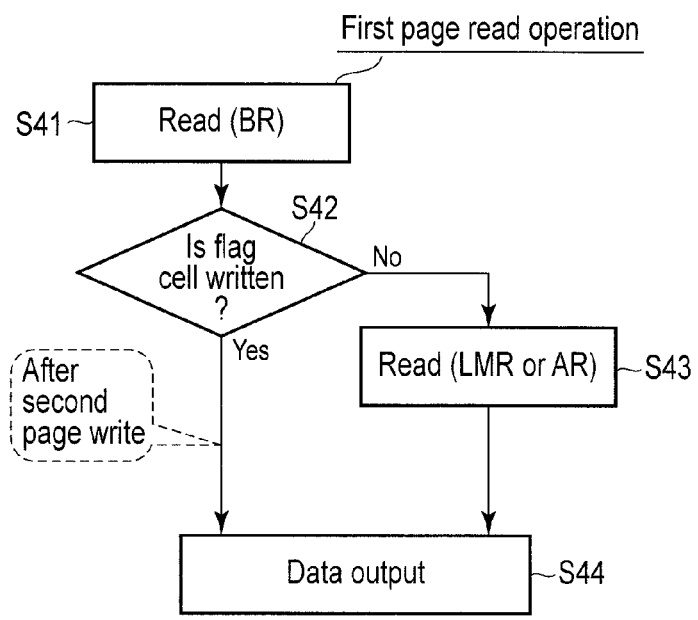
F I G. 15

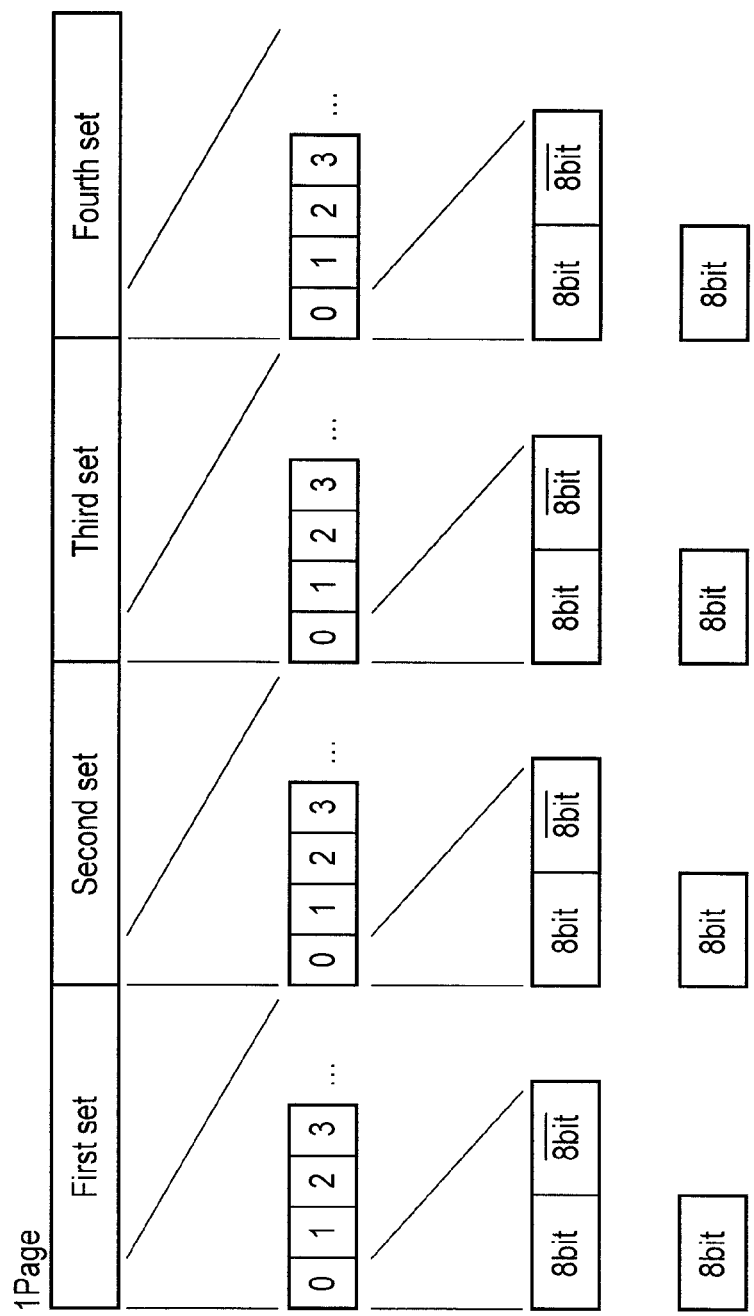
F I G. 18A
F I G. 18B

SEMICONDUCTOR MEMORY DEVICE WHICH STORES MULTILEVEL DATA

CROSS-REFERENCE TO RELATED APPLICATIONS

This application is based upon and claims the benefit of priority from Japanese Patent Application No. 2012-103645, filed Apr. 27, 2012, the entire contents of which are incorporated herein by reference.

FIELD

Embodiments described herein relate generally to a semiconductor memory device which is capable of storing data of, for example, 2 bits or more.

BACKGROUND

In a semiconductor memory device, for instance, a NAND flash memory, there is a tendency that capacitive coupling between neighboring cells increases with development in microfabrication of elements. Hence, there is a subject that a threshold voltage of a previously written memory cell varies due to data write of a neighboring cell. To cope with this, a method has been proposed, wherein after data is written in a neighboring cell, write is executed at a final threshold voltage. In this write method, by using a flag cell serving as a memory cell for a flag, it is discriminated whether data write of a second page has been executed. A dummy cell for suppressing a variation in the neighboring cell is disposed adjacent to the flag cell.

BRIEF DESCRIPTION OF THE DRAWINGS

FIG. 1 schematically illustrates the structure of a semiconductor memory device according to an embodiment.

FIG. 2 is a circuit diagram illustrating structures of a memory cell array and a bit line control circuit shown in FIG. 1.

FIG. 3 is a circuit diagram illustrating another example of the structures of the memory cell array and bit line control circuit shown in FIG. 2.

FIG. 4A and FIG. 4B are cross-sectional views illustrating a memory cell and a select transistor.

FIG. 5 is a cross-sectional view illustrating one NAND cell of the memory cell array.

FIG. 6 is a circuit diagram illustrating an example of a data storage circuit shown in FIG. 3.

FIG. 12A, FIG. 12B and FIG. 12C illustrate a variation of a threshold voltage of a flag cell.

FIG. 13A, FIG. 13B and FIG. 13C illustrate a variation of a threshold voltage of a dummy cell.

FIG. 14 is a flowchart illustrating a read operation of a second page.

FIG. 15 is a flowchart illustrating a read operation of a first page.

FIG. 18A and FIG. 18B illustrate a third modification of the embodiment.

DETAILED DESCRIPTION

Figure 7:
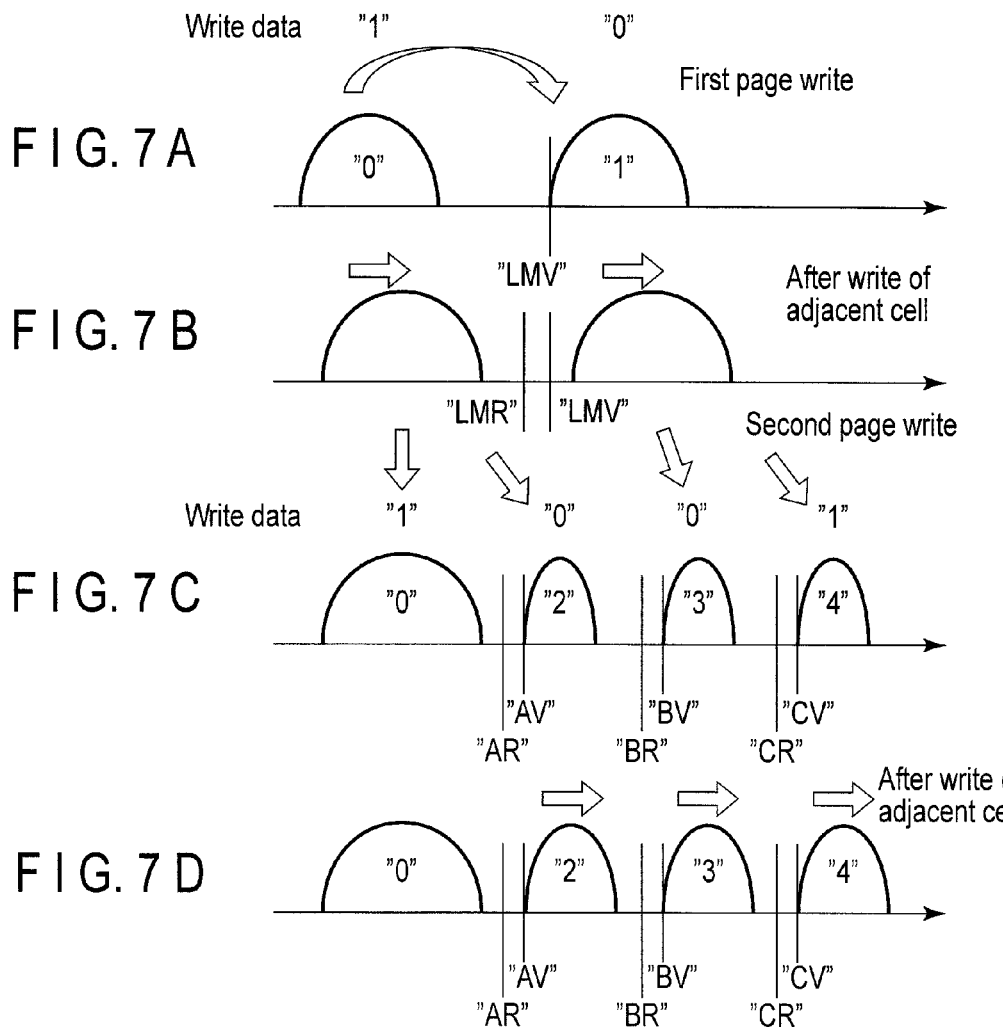
FIG. 7A to FIG. 7D illustrate an order of data write in a NAND cell.

In general, according to one embodiment, a semiconductor memory device includes a memory cell, a flag memory cell for a flag, a dummy cell and a controller. The flag memory cell is selected at the same time as the memory cell. The dummy cell is selected at the same time as the memory cell and the flag memory cell. The controller controls write and read of the memory cell, the flag memory cell and the dummy cell. By a first write operation, the controller sets a threshold voltage of the memory cell from a first threshold voltage to the first threshold voltage or a second threshold voltage (first threshold voltage<second threshold voltage). By a second write operation, the controller sets the threshold voltage of the memory cell to the first threshold voltage or a third threshold voltage (first threshold voltage<third threshold voltage) when the threshold voltage of the memory cell is the first threshold voltage, and sets the threshold voltage of the memory cell to a fourth threshold voltage or a fifth threshold voltage (second threshold voltage<=fourth threshold voltage<fifth threshold voltage) when the threshold voltage of the memory cell is the second threshold voltage. At a time of the second write operation, the controller sets a threshold voltage of the flag memory cell, which is selected at the same time as the memory cell, from the first threshold voltage to the fourth threshold voltage, and sets a threshold voltage of the dummy cell, which neighbors the flag memory cell, from the first threshold voltage to the third threshold voltage.

As described above, a dummy cell is disposed adjacent to a flag cell. However, since the dummy cell is not written, the threshold voltage of a memory cell, which is selected at the same time as the dummy cell and neighbors the dummy cell, becomes lower than threshold voltages of other cells. In particular, the threshold voltage of a flag cell neighboring the dummy cell becomes lower than the threshold voltages of other flag cells, and discrimination accuracy lowers as to whether the second page using this flag cell has been written or not.

Taking the above into account, in the present embodiment, data is written also in the dummy cell which neighbors the flag cell, thereby to prevent a decrease in threshold voltage of the flag cell neighboring the dummy cell and to enhance the discrimination accuracy as to whether the second page has been written or not.

Embodiments will now be described with reference to the accompanying drawings.

First Embodiment

FIG. 1 schematically shows the structure of a nonvolatile semiconductor memory device, for example, a NAND flash memory which stores, e.g. four values (2 bits).

A memory cell array 1 includes a plurality of bit lines, a plurality of word lines, and common source lines. In the memory cell array 1, electrically data erasable and programmable memory cells, which are composed of, e.g. EEPROM cells, are arranged in a matrix. A bit line control circuit 2 for controlling the bit lines and a word line control circuit 6 are connected to the memory cell array 1.

The bit line control circuit 2 includes, as will be described later, a plurality of data storage circuits, data storage circuits for flag cells, and data storage circuits for dummy cells. The bit line control circuit 2 executes such operations as reading out data in memory cells in the memory cell array 1 via the bit lines, detecting the states of the memory cells in the memory cell array 1 via the bit lines, and writing data in the memory cells by applying a write control voltage to the memory cells in the memory cell array 1 via the bit lines.

The bit line control circuit 2 is connected to a column decoder 3 and a data input/output buffer 4. Data storage circuits in the bit line control circuit 2 are selected by the column decoder 3. The data of the memory cell, which has been read out by the data storage circuit, is output to, for example, a memory controller MCN from a data input/output terminal 5 via the data input/output buffer 4.

In addition, write data, which has been input to the data input/output terminal 5 from the memory controller MCN, is input to the data storage circuit, which has been selected by the column decoder 3, via the data input/output buffer 4.

The word line control circuit 6 is connected to the memory cell array 1. The word line control circuit 6 selects a word line in the memory cell array 1, and applies a voltage, which is necessary for read, write or erase, to the selected word line.

The memory cell array 1, bit line control circuit 2, column decoder 3, data input/output buffer 4 and word line control circuit 6 are connected to a control signal & control voltage generation circuit 7 and are controlled by this control signal & control voltage generation circuit 7. The control signal & control voltage generation circuit 7 is connected to a control signal input terminal 8 and is controlled by control signals which are input from the outside via the control signal input terminal 8.

The bit line control circuit 2, column decoder 3, word line control circuit 6 and control signal & control voltage generation circuit 7 constitute a write circuit and a read circuit.

FIG. 2 shows an example of the structures of the memory cell array 1 and bit line control circuit 2 shown in FIG. 1. A plurality of NAND units is disposed in the memory cell array 1. One NAND unit comprises memory cells MC, which are composed of, e.g. 32 EEPROMs that are connected in series; and select gates S1 and S2. The first select gate S1 is connected to a bit line BL0e, and the second select gate S2 is connected to a source line SRC. The control gates of the memory cells, which are disposed in each row, are commonly connected to the word line, WL0 to WL31. In addition, the first select gates S1 are commonly connected to a select line SGD, and the second select gates S2 are commonly connected to a select line SGS.

The memory cell array 1 includes a plurality of blocks, as indicated by a broken line. Each block comprises a plurality of NAND units. For example, data is erased in units of a block.

Each word line is connected to a plurality of memory cells, a plurality of flag cells for storing flags, and a plurality of dummy flag cells (hereinafter referred to as "dummy cells").

In addition, a plurality of memory cells, which are disposed in every other bit line and are connected to one word line, flag cells FC, and dummy cells DC (memory cells in a range surrounded by a broken line) constitute one sector. Data is written and read in units of a sector. For example, data of two pages is stored in one sector. However, the data that is stored is not limited to two pages, and may be three or more pages.

In addition, the number of flag cells FC and the number of dummy cells DC are not limited to those shown in FIG. 2. As will be described later, the number of flag cells FC and the number of dummy cells DC may be three or more, respectively. In this case, one sector may include a plurality of flag cells FC and a plurality of dummy cells DC.

When a plurality of flag cells FC are included in one sector, the data that is stored in the flag cells is determined by a majority of data stored in the plural flag cells FC. Alternatively, when data is written in a predetermined number or more of flag cells, it may be determined that data is written in the flag cells.

The bit line control circuit 2 includes a plurality of data storage circuits 10, a data storage circuit 10a for flag cells, and a data storage circuit 10b for dummy cells. Each of the data storage circuits 10, the data storage circuit 10a for flag cells, and the data storage circuit 10b for dummy cells are connected to a pair of bit lines (BL0e, BL0o), (BL1e, BL1o), . . . , (BLne, BLno), (BLFD0e, BLFD0o), and (BLFD1e, BLFD1o), respectively. These pairs of bit lines are connected to the data storage circuits 10, 10a and 10b in units of a selected sector. Specifically, even-numbered bit lines BL0e, BL1e, . . . , BLne, BLFD0e and BLFD1e, and odd-numbered bit lines BL0o, BL1o, . . . , BLno, BLFD0o and BLFD1o, are selectively connected to the data storage circuits 10, 10a and 10b.

To be more specific, at times of a read operation, a program verify operation and a program operation, the plural data storage circuits 10, 10a and 10b select one of two bit lines (BLne, BLno) connected to the data storage circuit 10, 10a, 10b, in accordance with address signals (YA0, YA1, . . . , YAn, YAFD0, YAFD1) which are designated by the memory controller MCN. Further, in accordance with an external address, one word line is selected and one sector (two pages) is selected. The switching of the two pages is executed by an address.

In the meantime, the above-described erase operation is executed at the same time for the two bit lines which are connected to the data storage circuit 10, data storage circuit 10a for flag cells and data storage circuit 10b for dummy cells.

FIG. 3 illustrates another example of the structures of the memory cell array 1 and bit line control circuit 2 shown in FIG. 1. In the example shown in FIG. 2, half the number of memory cells MC, flag cells FC and dummy cells DC, which are connected to one word line, constitute one sector.

By contrast, in the case of the example shown in FIG. 3, all the memory cells MC, flag cells FC and dummy cells DC, which are connected to one word line, constitute one sector. Thus, the data storage circuits 10, 10a and 10b are connected to the respective bit lines. These data storage circuits 10, 10a and 10b are selected in accordance with address signals (YA0, YA1, . . . , YAn, YAD0, YAF0, YAF1, YAD1) which are designated from the outside.

FIG. 4A and FIG. 4B are cross-sectional views of a memory cell and a select transistor. FIG. 4A shows a memory cell. In a substrate 41, source/drain layer (n-type diffusion layers) 42 functioning as a source and a drain of the memory cell are formed. A charge storage layer (FG) 44 is formed on the substrate 41 via a gate insulation film 43. A control gate (CG) 46 is formed on the charge storage layer 44 via an insulation film 45. FIG. 4B shows a select gate. In a substrate 41, source/drain layer (n-type diffusion layers) 47 functioning as a source and a drain are formed. A control gate 49 is formed on the substrate 41 via a gate insulation film 48.

FIG. 5 is a cross-sectional view of one NAND cell of the memory cell array. In this example, one NAND cell is configured such that 16 memory cells MC each having the structure illustrated in FIG. 4A are connected in series. A first select gate S1 and a second select gate S2, each having the structure shown in FIG. 4B, are provided on the drain side and source side of the NAND cell.

FIG. 6 is a circuit diagram illustrating an example of the data storage circuit 10 shown in FIG. 3. The data storage circuit 10a for flag cells and the data storage circuit 10b for dummy cells are also configured like the data storage circuit 10.

The data storage circuit 10 includes a primary data cache (PDC), a secondary data cache (SDC), a dynamic data cache (DDC) and a temporary data cache (TDC). The SDC, PDC and DDC store input data at time of write, store read data at a time of read, temporarily store data at a time of verify, and are used for operations of internal data at a time of storing multilevel data. The TDC amplifies and temporarily stores data of a bit line at a time of data read, and is used for an operation of internal data at a time of storing multilevel data.

The SDC comprises clocked inverter circuits 61a and 61b which constitute a latch circuit, and transistors 61c and 61d. The transistor 61c is connected between an input terminal of the clocked inverter circuit 61a and an input terminal of the clocked inverter circuit 61b. The gate of the transistor 61c is supplied with a signal EQ2. The transistor 61d is connected between an output terminal of the clocked inverter circuit 61b and a ground. The gate of the transistor 61d is supplied with a signal PRST. A node N2a of the SDC is connected to an input/output data line IO via a column select transistor 61e, and a node N2b is connected to an input/output data line IOn via a column select transistor 61f. The gates of the transistors 61e and 61f are supplied with a column select signal CSLi. The node N2a of the SDC is connected to a node N1a of the PDC via transistors 61g and 61h. The gate of the transistor 61g is supplied with a signal BLC2, and the gate of the transistor 61h is supplied with a signal BLC1.

The PDC comprises clocked inverter circuits 61i and 61j, and a transistor 61k. The transistor 61k is connected between an input terminal of the clocked inverter circuit 61i and an input terminal of the clocked inverter circuit 61j. The gate of the transistor 61k is supplied with a signal EQ1. A node N1b of the PDC is connected to the gate of a transistor 61l. One end of the current path of the transistor 61l is grounded via a transistor 61m. The gate of the transistor 61m is supplied with a signal CHK1. The other end of the current path of the transistor 61l is connected to one end of the current path of each of transistors 61n and 61o which constitute a transfer gate. The gate of the transistor 61n is supplied with a signal CHK2n. The gate of the transistor 61o is connected to an output terminal of the clocked inverter circuit 61a. The other end of the current path of each of the transistors 61n and 61o is connected to a line COMi. The line COMi is a line common to all data storage circuits 10. When verify of all data storage circuits 10 is completed, the potential of the line COMi rises to a high level. Specifically, as will be described later, when verify is completed, the node N1b of the PDC is set at a low level. In this state, if the signals CHK1 and CHK2n are set at a high level, the potential of the line COMi is set at the high level in the case where the verify has been completed.

Further, the TDC comprises, e.g. a MOS capacitor 61p. The capacitor 61p is connected between a connection node N3 of the transistors 61g and 61h and a ground. In addition, the DDC is connected to the connection node N3 via a transistor 61q. The gate of the transistor 61q is supplied with a signal REG.

The DDC is composed of transistors 61r and 61s. A signal VREG is supplied to one end of the current path of the transistor 61r, and the other end of the current path of the transistor 61r is connected to the current path of the transistor 61q. The gate of the transistor 61r is connected to the node N1a of the PDC via the transistor 61s. A signal DTG is supplied to the gate of the transistor 61s.

Moreover, the connection node N3 is connected to one end of the current path of each of transistors 61t and 61u. The other end of the current path of the transistor 61u is supplied with a signal VPRE, and the gate of the transistor 61u is supplied with BLPRE. The gate of the transistor 61t is supplied with a signal BLCLAMP. The other end of the current path of the transistor 61t is connected to one end of a bit line BLo via a transistor 61v, and to one end of a bit line BLe via a transistor 61w. The other end of the bit line BLo is connected to one end of the current path of a transistor 61x. The gate of the transistor 61x is supplied with a signal BIASo. The other end of the bit line BLe is connected to one end of the current path of a transistor 61y. The gate of the transistor 61y is supplied with a signal BIASe. The other end of the current path of each of the transistors 61x and 61y is supplied with a signal BLCRL. The transistors 61x and 61y are turned on complementarily to the transistors 61v and 61w in accordance with the signals BIASo and BIASe, and supply the potential of the signal BLCRL to a non-selected bit line.

The above-described respective signals and voltages are generated by the control signal & control voltage generation circuit 7 shown in FIG. 1. Based on the control of the control signal & control voltage generation circuit 7, the operation to be described below is controlled.

In addition, the data storage circuit 10 shown in FIG. 3 has substantially the same structure as shown in FIG. 6, and only the connection to the bit lines is different. Specifically, as shown in FIG. 6, for example, only the transistor 61v is connected to the other end of the transistor 61t, and the bit line BL is connected via the transistor 61v.

The present memory is a multilevel memory, and can store 2-bit data in one cell. The switching of two bits is executed by addresses (first page, second page). When two bits are stored in one cell, addresses of two pages are used. When three bits are stored in one cell, switching is executed by addresses (first page, second page, third page). Further, when four bits are stored in one cell, switching is executed by addresses (first page, second page, third page, fourth page).

(Description of Operation)

The operation of the above-described structure is described.

FIG. 7A to FIG. 7D illustrate the relationship between data of a memory cell and a threshold voltage of the memory cell. If an erase operation is executed, the data of the memory cell becomes data "0", as shown in FIG. 7A. In this state, if data write of a first page is executed, the data of the memory cell may become data "0" or data "1". Specifically, when write data is "1", the threshold voltage of the memory cell is unchanged, and the data of the memory cell remains data "0". In addition, when write data is "0", the threshold voltage of the memory cell rises, and the data of the memory cell becomes "1". In FIG. 7A, "LMV" is a verify level of write of the first page.

Subsequently, data is written in an adjacent cell, prior to the write of the second page. Then, as shown in FIG. 7B, the threshold voltage of the memory cell rises due to the influence of the write of the adjacent cell, and the threshold voltage distribution widens. In FIG. 7B, "LMR" is a read level for reading out data of the first page.

Thereafter, if data of the second page is written, the data of the memory cell becomes data "0"~"3" having normal threshold voltages, as shown in FIG. 7C. Specifically, in the write of the first page, in the case where the data of the memory cell is "0" and write data is "1", the data of the memory cell remains data "0". In the case where the write data is "0", the threshold voltage rises and the data of the memory cell becomes "2".

In addition, in the write of the first page, when the data of the memory cell is "1" and write data is "0", the data of the memory cell becomes "3". When write data is "1", the threshold voltage rises and the data of the memory cell becomes "4".

In FIG. 7C, "AV", "BV and "CV" are verify levels of data write of the second page, and "AR", "BR" and "CR" are read levels for reading out data of the second page.

Thereafter, if data write of the adjacent cell is executed, as shown in FIG. 7D, the threshold voltage of the memory cell slightly rises, and the threshold voltage distribution widens.

In the embodiment, the data of the memory cell are defined from a lower side of the threshold voltage toward a higher side of the threshold voltage.

Figure 8:
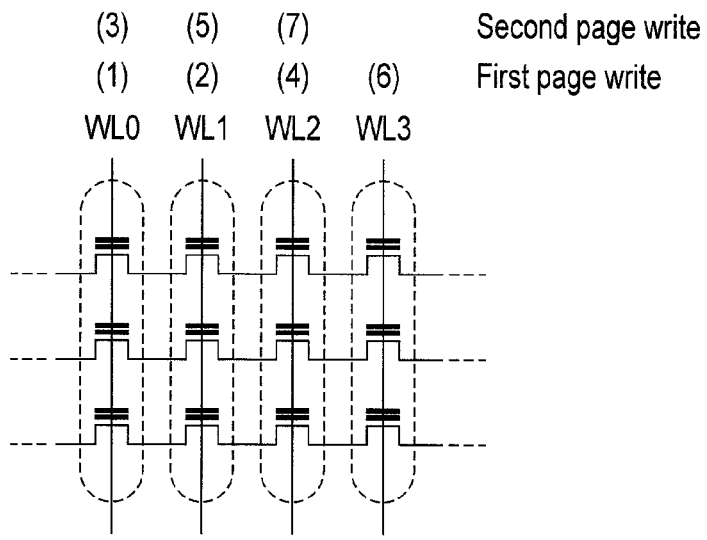
FIG. 8 illustrates an order of data write in a memory cell.

FIG. 8 illustrates an order of data write in a NAND unit. In the block, a write operation is executed in units of a page from memory cells closer to the source line. In FIG. 8, for the purpose of description, the number of word lines is set at four.

In a first write, 1-bit data is written in a first page of the memory cells connected to a word line WL0.

In a second write, 1-bit data is written in a first page of the memory cells connected to a word line WL1 neighboring the word line WL0.

In a third write, 1-bit data is written in a second page of the memory cells connected to the word line WL0.

In a fourth write, 1-bit data is written in a first page of the memory cells connected to a word line WL2 neighboring the word line WL1.

In a fifth write, 1-bit data is written in a second page of the memory cells connected to the word line WL1.

In a sixth write, 1-bit data is written in a first page of the memory cells connected to a word line WL3 neighboring the word line WL2.

In a seventh write, 1-bit data is written in a second page of the memory cells connected to the word line WL2.

Subsequently, similarly, data is successively written in the memory cells.

Figure 9:
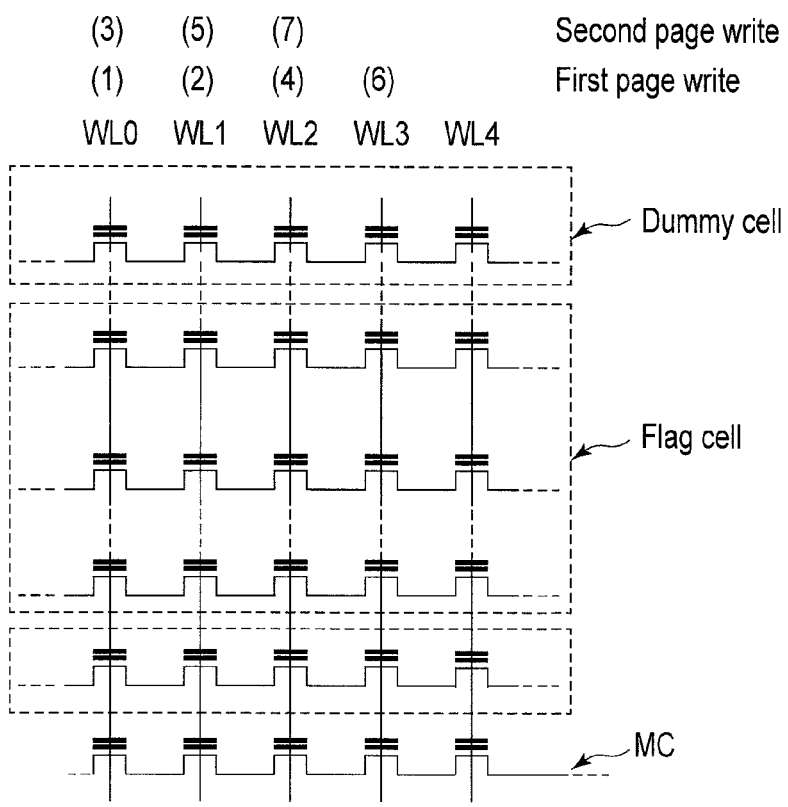
FIG. 9 illustrates an order of data write in memory cells, flag cells and dummy cells.

FIG. 9 illustrates an order of data write in memory cells MC, flag cells FC and dummy cells DC. This order of write is basically the same as in FIG. 8.

The flag cell is selected at the same time as the memory cell MC, and has a function of indicating whether data of the second page is written or not. In the flag cell FC, as will be described later, data is written at a time of data write of the second page.

Further in the present embodiment, data is also written in the dummy cell DC, which is selected at the same time as the flag cell FC. Like the flag cell, data is written in the dummy cell DC at the time of write of the second page.
(Program and Program Verify)
(First Page Program)

Figure 10:
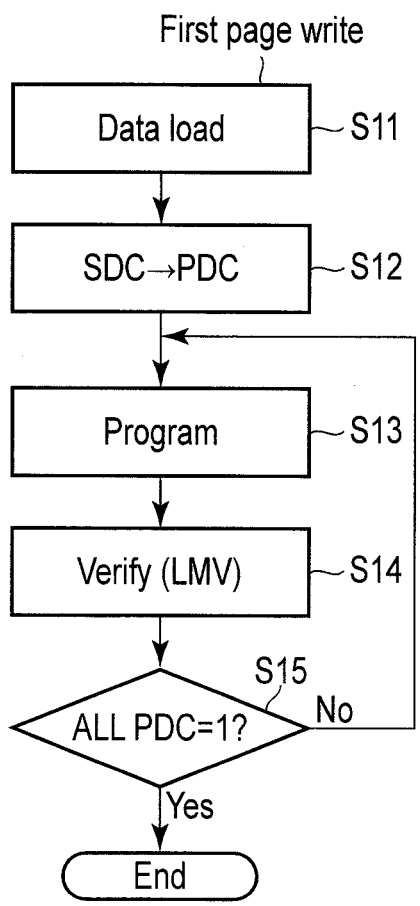
FIG. 10 is a flowchart illustrating a program operation of a first page.

FIG. 10 illustrates a program operation of a first page. In the program operation of the first page, an address is first designated and, for example, two pages (one sector) shown in FIG. 2 are selected. In the present memory, the program operation can be executed only in the order of a first page and a second page of the two pages. Thus, the first page is first selected in accordance with the address.

Next, write data is input from the outside and is stored in the SDC (shown in FIG. 6) of each of all data storage circuits 10 (S11).

If a write command is input, the data of the SDC of each of all data storage circuits 10 is transferred to the PDC (S12). Specifically, the signal BLC1, BLC2 is set at a predetermined voltage, for example, Vdd+Vth (Vdd: power supply voltage (e.g. 3 V or 1.8 V, but the voltage is not limited to these values), Vth: threshold voltage of N-channel MOS transistor), and the transistor 61$h$, 61$g$ is turned on. Then, the data at the node N2$a$ is transferred to the PDC via the transistor 61$g$, 61$h$. Accordingly, when data "1" (write is not executed) has been input from the outside, the node N1$a$ of the PDC rises to a high level. When data "0" (write is executed) has been input from the outside, the node N1$a$ of the PDC falls to a low level. Subsequently, the data of the PDC is the potential of the node N1$a$, and the data of the SDC is set to be the potential of the node N2$a$.

In the program of the first page, no data is written in the flag cell FC or in the dummy cell DC. Thus, data "1" is set in the PDC in the data storage circuit 10$a$ for flag cells and the PDC in the data storage circuit 10$b$ for dummy cells.
(Program Operation) (S13)

The potentials of the signals BLC1, BLCLAMP, and BLSo or BLSe shown in FIG. 6 are set at Vdd+Vth. Then, the transistor 61$h$, 61$t$, and 61$v$ or 61$w$ is turned on, and the data stored in the PDC is supplied to the bit line. When data "1" (write is not executed) is stored in the PDC, the bit line potential is Vdd. When data "0" (write is executed) is stored in the PDC, the bit line potential is Vss (ground potential). In addition, data write must not be executed in cells of a non-selected page (bit line is not selected), which are connected to a selected word line. Thus, like data "1", Vdd is similarly supplied to the bit line connected to these cells.

Vdd is applied to the select line SGD of the selected block, a potential PGM (20 V) is applied to the selected word line, and a potential VPASS (10 V) is applied to the non-selected word line. Then, if the bit line is at Vss, the channel of the cell is at Vss and the word line is at VPGM. Thus, the memory cell is written. On the other hand, when the bit line is at Vdd, the channel of the cell is not at Vss and is set at, e.g. about VPGM/2 by coupling by increasing the VPGM. Thus, this cell is not programmed.

When write data is "0", as shown in FIG. 7A, the threshold voltage of the memory cell rises, and the memory cell is set at data "1". In addition, when write data is "1", the threshold voltage of the memory cell is unchanged, and the data of the memory cell remains "0".
(First Page Verify) (S14)

In the program verify operation, a potential, which is slightly higher than a potential at a time of read, is supplied to the selected word line.

Specifically, as shown in FIG. 7A, in the verify operation of the first page, a verify voltage "LMV" (shown in FIG. 10) is supplied to the selected word line.

In this state, at first, a potential Vread for data read is supplied to the non-selected word line in the selected block and the select line SGD, the signal BLPRE of the data storage circuit 10 shown in FIG. 6 is set at, e.g. Vdd+Vth, the BLCLAMP is set at a predetermined voltage, e.g. 1V+Vth, the signal VPRE is set at Vdd, and the bit line is precharged to 1 V.

Next, the source-side select line SGS of the cell is set at the high level. Cells having a higher threshold voltage than potential "LMV" are turned off. Thus, the bit line remains at the high level. In addition, cells having a lower threshold voltage than potential "LMV" are turned on. Thus, the bit line is at Vss. While the bit line is being discharged, VPRE is set at VPRE=Vss and BLPRE is set at BLPRE=high level, thereby setting the TDC at Vss. Thereafter, the signal REG is set at Vdd+Vth and VREG is set at Vdd, thereby turning on the transistor 61$q$, and the data of the DDC is transferred to the TDC.

Subsequently, the signal DTG is set at Vdd+Vth, and thereby the transistor 61$s$ is once turned on and the data of the PDC is transferred to the DDC. The transferred data is stored as the gate potential of the transistor 61$r$.

Thereafter, the signal BLC1 is set at, e.g. Vdd+Vth, and thereby the transistor 61*h* is turned on and the data of the TDC is transferred to the PDC.

Next, the signal BLPRE is set at a predetermined voltage, e.g. Vdd+Vth, thereby setting VPRE=Vdd, and thus the node N3 of the TDC is precharged to Vdd. Then, the signal BLCLAMP is set at a predetermined voltage, e.g. 0.9V+Vth, and the transistor 61*t* is turned on. The node N3 of the TDC is at the low level when the bit line is at the low level, and the node N3 is at the high level when the bit line is at the high level.

When data write is executed, the low level is stored in the DDC of FIG. 6. When data write is not executed, the high level is stored in the DDC. Accordingly, if the signal VREG is set at Vdd and the signal REG is set at the high level, the node N3 of the TDC is forcibly set at the high level only when data write is not executed. After this operation, the data of the PDC is transferred to the DDC, and the potential of the TDC is transferred to the PDC. The case in which the high level signal is latched in the PDC is only the case where data write is not executed in the cell, or the case where data "1" is written in the cell and the threshold voltage of the cell has reached the verify potential "LMV". In addition, the case in which the low level signal is latched in the PDC is the case where the threshold voltage of the cell has not reached "LMV".

When the PDC is at the low level, the write operation is executed once again, and the program operation and verify operation are repeated until the data of all data storage circuits 10 or a predetermined number or more of data storage circuits 10 reaches the high level (S15 to S13).

(Adjacent Cell Program)

As illustrated in FIG. 8 and FIG. 9, for example, after 1-bit data has been written in the first page of the memory cells connected to the word line WL0, data of the first page is written in the memory cells connected to the word line WL1 neighboring the word line WL0. If the write operation of the neighboring cell is executed in this manner, the threshold voltage of the memory cell connected to the word line WL0 rises, as shown in FIG. 7B, depending on write data, due to an inter-floating-gate capacitance of the neighboring cell. Consequently, the threshold voltage distributions of data "0" and data "1" of the memory cell widen to the high potential side.

Thereafter, the data of the second page is written in the memory cells connected to the word line WL0.

(Second Page Program)

Figure 11:
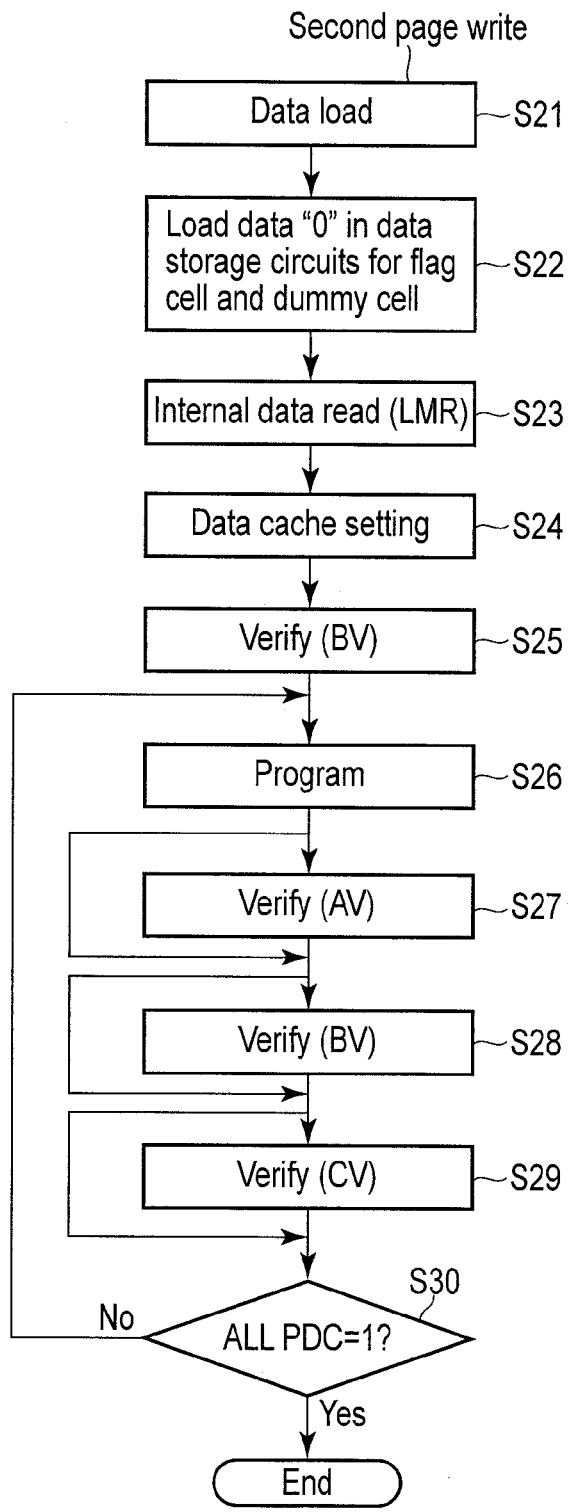
FIG. 11 is a flowchart illustrating a program operation of a second page.

FIG. 11 illustrates a program operation of a second page. Also in the program operation of the second page, for example, two pages shown in FIG. 2 are selected in accordance with an address.

Next, write data is input from the outside and is stored in the SDC of each of all data storage circuits 10 (ST21). When data "1" (write is not executed) has been input from the outside, the node N2*a* of the SDC of the data storage circuit 10 shown in FIG. 6 rises to a high level. When data "0" (write is executed) has been input from the outside, the node N2*a* of the SDC falls to a low level.

Subsequently, when a write command has been input, data is written in the flag cell FC and dummy cell DC since the program of the second page is executed. Thus, data "0" is input to the SDC in the data storage circuit 10*a* for flag cells and the SDC in the data storage circuit 10*b* for dummy cells (S22).

As has been described above, in order to enhance reliability, each of the flag cell FC and dummy cell DC may be composed of a plurality of cells. In this case, in the program of the second page, data "0" is input to the SDC of each of the data storage circuits 10*a* and 10*b* corresponding to the plural flag cells FC and dummy cells DC.

In the program of the second page, as shown in FIG. 7C, in the case where the data of the memory cell is "0", if the data that is input from the outside is "1", the data of the memory cell is set to remain "0", and if the data that is input from the outside is "0", the data of the memory cell is set at "2".

In addition, in the case where the data of the memory cell is "1", if the data that is input from the outside is "0", the data of the memory cell is set at "3", and if the data that is input from the outside is "1", the data of the memory cell is set at "4".

(Internal Data Read)

To begin with, prior to data write in the cell, an internal read operation is executed in order to determine whether the data of the memory cell of the first page is "0" or "1" (S23). The internal data read is all the same as the read operation. Usually, when it is determined whether the data of the memory cell is "0" or "1", a voltage "LMR" for data read is supplied to the selected word line.

At first, a voltage Vread is applied to the non-selected word line in the selected block and the select line SGD. In addition, the signal VPRE of the data storage circuit 10 is set at Vdd, the signal BLPRE, BLCLAMP is set at a predetermined voltage, e.g. 1V+Vth, and the bit line is precharged to Vdd. Then, the source-side select line SGS of the cell is set at the high level. When the threshold voltage of the memory cell is higher than voltage "LMR", the cell is turned off. Accordingly, the bit line remains at the high level. In addition, when the threshold voltage of the memory cell is lower than voltage "LMR", the cell is turned on. Thus, the charge of the bit line is discharged, and the bit line is set at the ground potential Vss.

Next, the signal VPRE of the data storage circuit 10 is set at Vdd, the signal BLPRE is set at Vdd+Vth, and the node N3 of the TDC is precharged to Vdd. Thereafter, the signal BLCLAMP is set at 0.9V+Vth. The node N3 of the TDC is at the low level when the bit line is at the low level, and the node N3 of the TDC is at the high level when the bit line is at the high level.

Subsequently, the potential of the TDC is transferred to the PDC. As a result, when the data of the memory cell is "1", the high level signal is latched in the PDC, and when the data of the memory cell is "0", the low level signal is latched in the PDC.

(Setting of Data Cache) (S24)

Thereafter, in the manner as described above, the data of the PDC, DDC and SDC is transferred and operation is executed, and the data is set in the PDC, DDC and SDC.

In the case where the data of the memory cell is set at "0" (in the case where the write data of the first page is "1" and the write data of the second page is "1"), the PDC is at the high level, the DDC is at the low level and the SDC is at the high level.

In the case where the data of the memory cell is set at "2" (in the case where the write data of the first page is "1" and the write data of the second page is "0"), the PDC is at the low level, the DDC is at the high level and the SDC is at the high level.

In the case where the data of the memory cell is set at "3" (in the case where the write data of the first page is "0" and the write data of the second page is "0"), the PDC is at the low level, the DDC is at the high level and the SDC is at the low level.

In the case where the data of the memory cell is set at "4" (in the case where the write data of the first page is "0" and the write data of the second page is "1"), the PDC is at the low level, the DDC is at the low level and the SDC is at the low level.

In addition, the data of the PDC, DDC and SDC is set so that the flag cell FC sets the data of the memory cell MC at "2" and the dummy cell DC sets the data of the memory cell MC at "1".

(Second Page Verify: Verify of Memory Cell Data "3") (S25)

There is a case in which the threshold voltage of a cell, in which data "3" is written, rises due to data write of a neighboring cell, and there is a cell in which a normal verify voltage "BV" has been reached. Thus, although verify of data "3" may be first executed, this verify may be omitted. In the verify operation of data "3", a voltage "BV", which is slightly higher than the voltage "BR" for data read, is applied to the selected word line.

Next, a potential Vread is applied to the non-selected word line in the selected block and the select line SGD, the signal BLCLAMP of the data storage circuit 10 shown in FIG. 6 is set at 1V+Vth, the signal REG is set at Vdd+Vth, and the bit line is precharged.

When data "0", "4" is written in the memory cell, the DDC is set at the low level, as described above. Thus, the bit line is not precharged. In addition, when data "2", "3" is written in the memory cell, the DDC is set at the high level. Thus, the bit line is precharged.

Next, the source-side select line SGS of the NAND unit is set at the high level. When the threshold voltage of the cell is higher than "BV", the cell is turned off. Thus, the bit line remains at the high level. In addition, when the threshold voltage of the cell is lower than "BV", the cell is turned on. Thus, the bit line is set at Vss. While the bit line is being discharged, the node N3 of the TDC is once set at Vss. Thereafter, the signal REG is set at the high level, thereby turning on the transistor 61$q$, and the data of the DDC is transferred to the TDC.

Subsequently, the signal DTG is set at Vdd+Vth, and thereby the transistor 61$s$ is once turned on and the data of the PDC is transferred to the DDC. Then, the data of the TDC is transferred to the PDC.

Next, the signal VPRE is set at Vdd and the signal BLPRE is set at Vdd+Vth, and thereby the node N3 of the TDC is precharged to Vdd. Then, the signal BLCLAMP is set at 0.9V+Vth, and the transistor 61$t$ is turned on. Thus, the node N3 of the TDC is at the low level when the bit line is at the low level, and the node N3 is at the high level when the bit line is at the high level.

When data write is executed, the low level signal is stored in the DDC, and when data write is not executed, the high level signal is stored in the DDC. Accordingly, if the signal VREG is set at Vdd and the signal REG is set at Vdd+Vth, the node N3 of the TDC is forcibly set at the high level only when data write is not executed.

Thereafter, the data of the PDC is transferred to the DDC, and the potential of the TDC is read in the PDC. The high level signal is latched in the PDC, only in the case where data write is not executed, or in the case where data "3" is written in the memory cell and the threshold voltage of the cell has reached "BV" that is the verify voltage. The case in which the low level signal is latched in the PDC is the case where the threshold voltage of the cell has not reached "BV", or the case where data "2", "4" is written in the memory cell.

(Program Operation) (S26)

The program operation is all the same as the program operation of the first page. When data "1" is stored in the PDC, data write is not executed. When data "0" is stored in the PDC, data write is executed.

(Second Page Verify: Verify of Memory Cell Data "2") (S27)

As illustrated in FIG. 7C, in this program verify operation, a voltage "AV", which is slightly higher than the voltage "AR" for data read, is applied to the selected word line.

To begin with, a read voltage Vread is applied to the non-selected word line in the selected block and the select line SGD. The signal BLCLAMP of the data storage circuit 10 is set at 1V+Vth, the BLC2 is set at Vdd+Vth, and the bit line is precharged. When data "3", "4" is written in the memory cell, the data stored in the SDC is "0" (low level). Thus, the bit line is not precharged. The bit line is precharged only at the time of writing data "0", "2" in the memory cell.

Next, the source-side select line SGS of the cell is set at the high level. When the threshold voltage of the memory cell is higher than "AV", the cell is turned off. Thus, the bit line remains at the high level.

In addition, when the threshold voltage of the memory cell is lower than "AV", the cell is turned on. Thus, the bit line is set at Vss. While the bit line is being discharged, the node N3 of the TDC is once set at Vss, the signal REG is set at the high level, thereby turning on the transistor 61$q$, and the data of the DDC is transferred to the TDC.

Subsequently, the signal DTG is set at the high level, the transistor 61$s$ is once turned on and the data of the PDC is transferred to the DDC. Then, the data of the TDC is transferred to the PDC.

Next, the signal BLPRE of the data storage circuit is set at Vdd+Vth, and thereby the transistor 61$u$ is turned on and the node N3 of the TDC is precharged to Vdd. Then, the signal BLCLAMP is set at 0.9V+Vth, and the transistor 61$t$ is turned on. Thus, the node N3 of the TDC is at the low level when the bit line is at the low level, and the node N3 is at the high level when the bit line is at the high level.

When data write is executed, the low level is stored in the DDC, and when data write is not executed, the high level is stored in the DDC. Accordingly, if the signal VREG is set at Vdd and the signal REG is set at the high level, the node N3 of the TDC is forcibly set at the high level only when data write is not executed. After this operation, the data of the PDC is transferred to the DDC, and the voltage of the TDC is transferred to the PDC.

The high level is latched in the PDC, only in the case where data write is not executed, or in the case where data "2" is written in the memory cell and the threshold voltage of the cell has reached the verify potential "AV". The case in which the low level is latched in the PDC is the case where the threshold voltage of the cell does not reach "AV", or the case where data "3" is written in the memory cell.

(Second Page Verify: Verify of Memory Cell Data "3") (S28)

Verify of data "3" of the memory cell is executed, like the verify of data "3" of the memory cell which was executed prior to program.

(Second Page Verify: Verify of Memory Cell Data "4") (S29)

In this program verify operation, as illustrated in FIG. 7C, a voltage "CV", which is slightly higher than the voltage "CR" for data read, is applied to the selected word line. In this state, to begin with, Vread is applied to the non-selected word line in the selected block and the select line SGD. The signal BLCLAMP is set at 1V+Vth, the BLPRE is set at Vdd+Vth, the transistors 61$t$ and 61$u$ are turned on, and the bit line is precharged.

Next, the source-side select line SGS of the cell is set at the high level. Cells having a higher threshold voltage than potential "CV" are turned off. Thus, the bit line remains at the high level.

In addition, cells having a lower threshold voltage than potential "CV" are turned on. Thus, the bit line is at Vss. While the bit line is being discharged, the node N3 of the TDC is set at Vss, the signal REG is set at the high level, the transistor 61q is turned on, and the data of the DDC is transferred to the TDC.

Next, the signal DTG is set at the high level, the transistor 61s is turned on, and the data of the PDC is transferred to the DDC. Then, the data of the TDC is transferred to the PDC.

Subsequently, the signal BLPRE is set at Vdd+Vth, the transistor 61u is turned on, and the node N3 of the TDC is precharged to Vdd. Then, the signal BLCLAMP is set at 0.9V+Vth, and the transistor 61t is turned on. The node N3 of the TDC is at the low level when the bit line is at the low level, and the node N3 is at the high level when the bit line is at the high level.

When data write is executed, the low level is stored in the DDC. When data write is not executed, the high level is stored in the DDC. Accordingly, the signal VREG is set at Vdd, the signal REG is set at the high level, and the transistor 61q is turned on. Then, the node N3 of the TDC is forcibly set at the high level only when data write is not executed. After this operation, the data of the PDC is transferred to the DDC, and the voltage of the TDC is transferred to the PDC.

The high level signal is latched in the PDC, only in the case where data write is not executed, or in the case where data "4" is written in the memory cell and the threshold voltage of the cell has reached the verify potential "CV". In addition, the case in which the low level signal is latched in the PDC is the case where the threshold voltage of the cell has not reached the verify voltage "CV" or the case where data "2", "3" is written in the memory cell.

When the PDC is at the low level, the program operation is executed once again, and the program operation and verify operation are repeated until the data of the PDC of each of all data storage circuits or a predetermined number or more of data storage circuits reaches the high level (S30 to S26).

In the meantime, in the data write of the second page, before the program and verify of data "2" in the memory cell are completed, it is highly possible that data "3", "4", which has a higher threshold voltage than data "2", has not been written. Thus, before the program and verify of data "2" are completed, verify of data "3", "4" may be skipped.

In addition, in the program and verify of data "4", it is highly possible that the program and verify of data "2", "3" have already been completed. Thus, in the program and verify of data "4", verify of data "2", "3" may be skipped.

(Program of Flag Cell and Dummy Cell)

When program of the second page is executed in the memory cell, the flag cell FC and dummy cell DC are also programmed.

Data write is executed in the flag cell FC from an erase state shown in FIG. 12A to a state shown in FIG. 12B. This state is the same as the write of data "3" of the memory cell.

Thereafter, when a neighboring cell has been written, the threshold voltage of the flag cell FC slightly rises, as shown in FIG. 12C, and the threshold voltage distribution widens.

In addition, data write is executed in the dummy cell DC from an erase state shown in FIG. 13A to a state shown in FIG. 13B. This state is the same as the write of data "2" of the memory cell.

Thereafter, when a neighboring cell has been written, the threshold voltage of the dummy cell DC slightly rises, as shown in FIG. 13C, and the threshold voltage distribution widens.

In addition, with data write being executed in the dummy cell DC, the threshold voltage of the flag cell FC, which neighbors the dummy cell DC, increases.

In the meantime, in FIG. 12 and FIG. 13, verify levels "A", "B" and "C" are voltages similar to verify levels "AV", "BV" and "CV" of the memory cell MC.

(Second Page Read)

FIG. 14 illustrates a read operation of a second page. In the read operation of the second page, an address is first designated and, for example, the two pages shown in FIG. 2 are selected. As shown in FIG. 7B and FIG. 7C, the distributions of threshold voltages vary before and after the data write of the second page. After the data write of the second page, the distribution shown in FIG. 7C is obtained. Thus, at first, a voltage "AR" is supplied to the word line and data read is executed from the flag cell FC and memory cell MC (S31), and it is determined whether the flag cell FC is written or not (S32).

In step S32, if it is determined that the flag cell FC is written, the data write of the second page has executed. Thus, a read level "CR" is supplied to the word line, and a data read operation of the memory cell MC is executed (S33). Thereafter, the data, which has been read out to the data storage circuit, is output to the outside (S34).

In the meantime, when there are a plurality of flag cells FC, the determination in step S32 is executed by a majority of data that is read out from the plural flag cells FC, or based on whether the number of written flag cells FC is a predetermined number or more.

On the other hand, in step S32, if it is determined that the flag cell FC is not written, the data write of the second page is not executed. Thus, output data is set at a fixed value (e.g. "1") (S35), and the data is output to the memory controller MCN (S34).

(First Page Read)

FIG. 15 illustrates a read operation of a first page. An address is first designated and, for example, the two pages shown in FIG. 2 are selected. As shown in FIG. 7B and FIG. 7C, the distributions of threshold voltages vary before and after the write of the second page. Thus, at first, the voltage of the word line is set at a read level "BR", a data read operation is executed from the flag cell FC and memory cell, and it is determined whether the flag cell FC is written or not (S41, S42).

When there are a plurality of flag cells FC, the determination in step S42 is executed by a majority of data that is read out from the plural flag cells FC, or based on whether the number of written flag cells FC is a predetermined number or more.

In step S42, if it is determined that the flag cell FC is not written, the data write of the second page has not executed. Thus, the distribution of the threshold voltage of the cell is as shown in FIG. 7A or FIG. 7B. Accordingly, in order to determine the data of the memory cell MC, a read level "LMR" (or AR) is supplied to the word line, and a data read operation of the memory cell is executed (S43). Thereafter, the data, which has been read out to the data storage circuit, is output to the memory controller MCN (S44).

On the other hand, in step S42, if it is determined that the flag cell FC is written, the data write of the second page is executed. Thus, the distribution of the threshold voltage of the cell is as shown in FIG. 7C or FIG. 7D. Accordingly, the data, which has been read out in step S41, is output to the memory controller MCN (S44).

Figure 16:
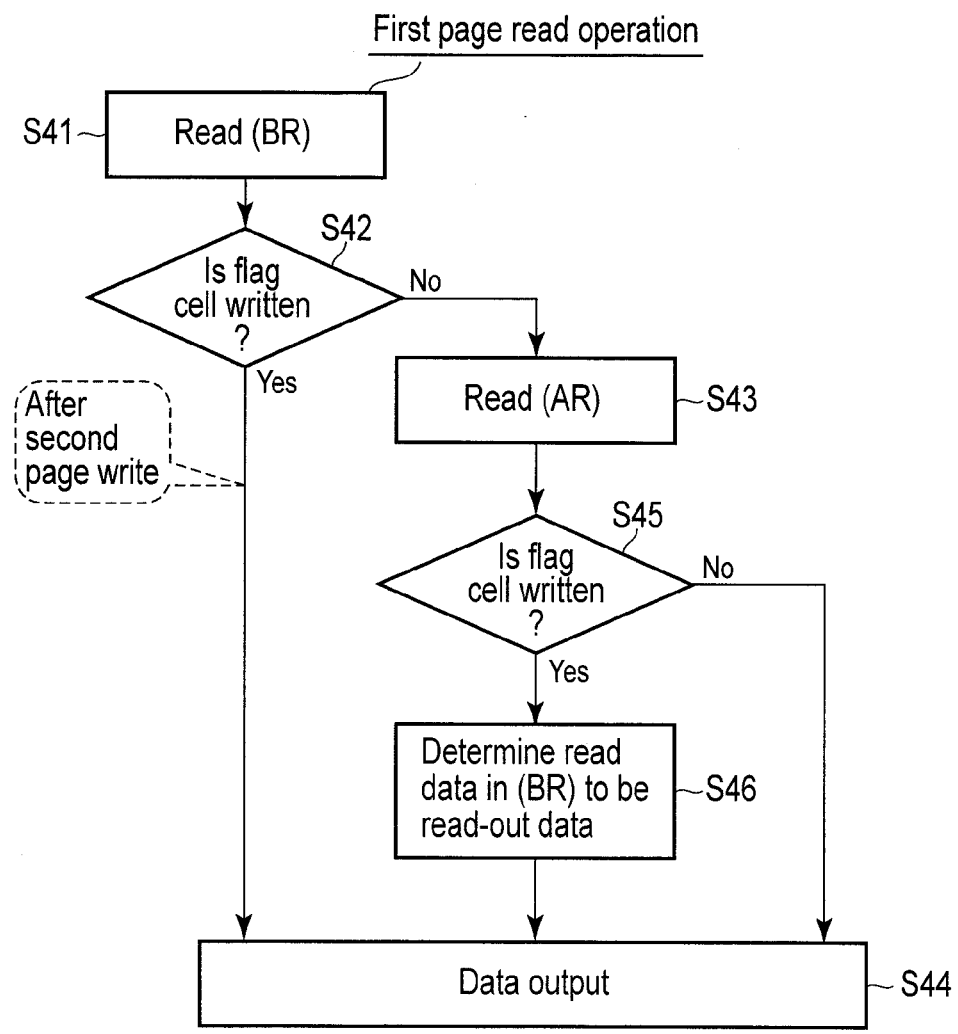
FIG. 16 is a flowchart illustrating another example of the read operation of the first page.

In addition, as illustrated in FIG. 16, in step S42, if data is read out of the flag cell FC and it is determined that the flag cell is not written, a read level "AR" is supplied to the word line while at least the data, which is read out of the cells other than the flag cell FC, is stored in the data storage circuit, and the data read operation is executed from the flag cell FC and memory cell (S43). Thereafter, the flag cell is determined once again (S45). As a result, when flag cell is not written, data write of the second page is not executed. Thus, the distribution of the threshold voltage of the memory cell MC is as shown in FIG. 7A or FIG. 7B. Accordingly, the data, which has been read out with the read level "AR", is output to the outside (S44). On the other hand, if the flag cell is written, the data of the second page is written. Thus, data is read out of the memory cell MC with the word line voltage (read level) "BR" which is stored in the data storage circuit (S46), and the read-out result is output as read-out data to the memory controller MCN (S44). Thereby, since the data of the flag cell, which is written at the threshold level of level "B", is read out with the read level "AR" of level "A", the reliability of the flag cell can be enhanced.

According to the present embodiment, the flag cell FC and dummy cell DC, which are selected at the same time as the memory cell MC, are provided. When the data write of the second page is executed in the memory cell MC, the flag cell FC is written at the read level "B" which is similar with data "3" set in the memory cell, and the dummy cell DC neighboring the flag cell FC is written at the read level "A" which is similar with data "2" set in the memory cell MC. Thus, after the write of the second page, the threshold voltage of the flag cell FC neighboring the dummy cell DC can be prevented from becoming lower than the threshold voltage of other flag cells which are written at the level "B". Therefore, the reliability of the data of the flag cell can be enhanced. As a result, when it is determined, based on the data of the flag cell FC, whether the second page is written or not, the reliability of the determination result can be enhanced.

In addition, the dummy cell DC is written at the level "A" which is lower than in the flag cell FC. Thus, it is possible to suppress the problem that the variation of the threshold voltage of the memory cell MC, which is located opposite to the flag cell FC of the dummy cell DC, increases.

In the meantime, when there is no problem with the variation of the threshold voltage of the memory cell MC which is located opposite to the flag cell FC of the dummy cell DC, the dummy cell DC can be written at the level "B", like the flag cell FC.

As described above, in the case where a plurality of flag cells FC are used, the determination of the data of the plural flag cells FC is executed by a majority of data, or based on whether a predetermined number or more of flag cells are written. As regards the determination as to whether a predetermined number or more of flag cells are written, for example, in the case where 12 flag cells are used and the predetermined number is "5", it is determined that the data of the flag cells is written if the data, which is read out from five or more flag cells FC, is written, and it is determined that the data of the flag cells is not written if the data, which is read out from four or less flag cells FC, is written.

In the meantime, the dummy cell DC, unlike the flag cell FC, is not used in determining whether the second page of the memory cell is written or not.

(First Modification)

Figure 17:
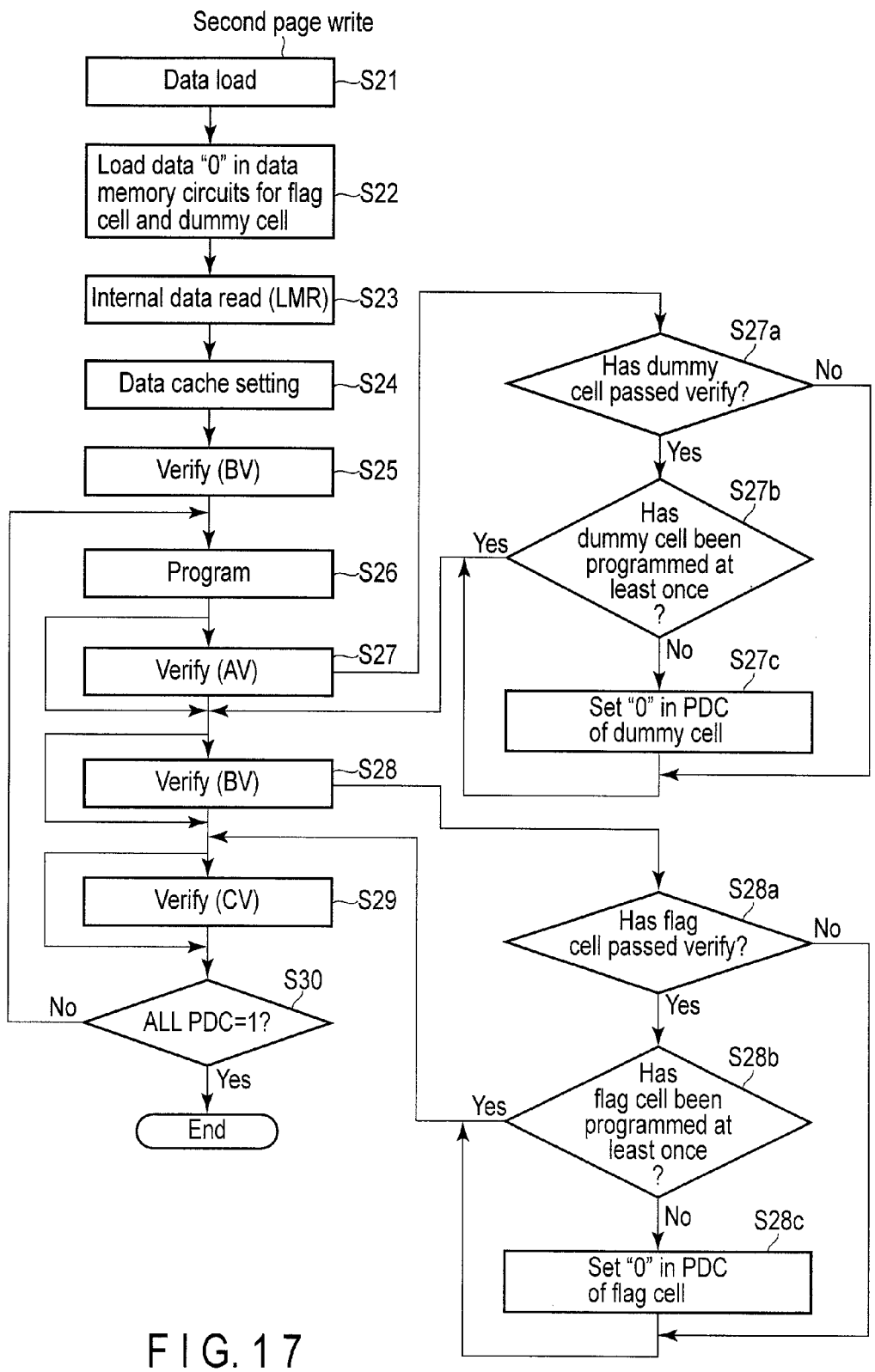
FIG. 17 is a flowchart illustrating a first modification and a second modification of the read operation of the second page.

In FIG. 17, steps S27a to S27c illustrate a first modification of the embodiment.

In the above-described embodiment, the dummy cell DC, together with the flag cell FC, is written at the time of the program of the second page of the memory cell MC. The dummy cell DC is written at level "A", as described above.

In the present modification, in the verify by the verify level "AV", the dummy cell DC is written at a threshold voltage different from the threshold voltage of the memory cell MC.

Specifically, in the verify (S27) by the verify level "AV", it is determined whether the dummy cell DC has passed the verify (S27a). If the determination result shows that the dummy cell DC has not passed the verify, control is transitioned to verify (S28) by the verify level "BV".

If the dummy cell DC has passed the verify, it is determined whether a program voltage has been applied to the dummy cell DC at least once (a plural number of times may be set) after the pass of the verify of the dummy cell DC (S27b). If the determination result shows that program has not been executed after the pass of the verify of the dummy cell DC, data "0" is set in the PDC of the dummy cell, and a program voltage is applied to the dummy cell DC once again (S27c).

In step S27b, if it is determined that a program voltage has been applied to the dummy cell at least once (a plural number of times may be set) after the pass of the verify of the dummy cell, data "1" is set in the PDC of the dummy cell DC, and thereafter no data write is executed in the dummy cell DC.

According to the above-described modification, in the state in which the dummy cell DC has passed the program verify and the threshold voltage of the dummy cell DC is set at level "A" or more, a program voltage is further applied to the dummy cell DC at least once, and the threshold voltage of the dummy cell DC is raised. Thus, the threshold voltage of the flag cell FC, which neighbors the dummy cell DC, can be increased, and the reliability of the flag cell FC can be enhanced.

In the above modification, the description has been given of the case in which the dummy cell DC is set at data "2" and verify voltage "AV". However, the modification is not limited to this example, and may be applied to the case in which the dummy cell DC is set at data "3" and verify voltage BV.

(Second Modification)

In FIG. 17, steps S28a to S28c illustrate a second modification of the embodiment.

In the above-described embodiment, the flag cell FC is written at the time of the program of the second page of the memory cell MC. The flag cell FC is written at level "B", as described above.

In the present modification, in the verify by the verify level "BV", the flag cell FC is written at a threshold voltage different from the threshold voltage of the memory cell MC.

Specifically, in the verify (S28) by the verify level "BV", it is determined whether the flag cell FC has passed the verify (S28a). If the determination result shows that the flag cell FC has passed the verify, control is transitioned to verify (S29) by the verify level "CV".

If the flag cell FC has passed the verify, it is determined whether a program voltage has been applied to the flag cell FC at least once (a plural number of times may be set) after the pass of the verify of the flag cell FC (S28b). If the determination result shows that no program voltage has been applied after the pass of the verify of the flag cell FC, data "0" is set in the PDC of the flag cell, and a program voltage is applied to the flag cell FC once again (S28c).

In step S28b, if it is determined that a program voltage has been applied to the flag cell FC at least once (a plural number of times may be set) after the pass of the verify of the flag cell FC, data "1" is set in the PDC of the flag cell FC, and thereafter no data write is executed in the flag cell FC.

According to the above-described second modification, in the state in which the flag cell FC has passed the program verify and the threshold voltage of the flag cell FC is set at level "B" or more, only the flag cell FC is programmed at least once, and the threshold voltage of the flag cell FC is raised. Since the read level of the flag cell is "BR" or "AR", the threshold voltage of the flag cell FC can be increased, and the reliability of the flag cell FC can further be enhanced.

The above-described first modification and second modification may be implemented singly, or may be used in combination.

(Third Modification)

In addition, the reliability of the memory cell can be enhanced, like the above-described embodiment. However, in the semiconductor memory device, for example, in data write, there is a case in which data whose reliability needs to be enhanced, such as parameters for operating the semiconductor memory device and security information, is stored in a part of blocks or pages.

As in the above case, when the reliability of data is to be enhanced, for example, 1-bit data is stored in one cell. Alternatively, no data is written in the second page, and data is written in only the first page.

Besides, when the reliability is to be enhanced, an ECC circuit is mounted in the chip. However, in this case, it is possible that the scale of the circuit increases.

In addition, in the case of data which is used in the chip, such as parameters for operating the semiconductor memory device, the data may be output to the outside of the chip and subjected to an ECC process on the outside of the chip, and then the data may be restored in the chip. In this case, however, since data input/output operations are necessary, the operations may become complex.

Thus, as illustrated in FIG. 18A and FIG. 18B, one page is divided into a plurality of sets, and the same data is stored in each set. At a time of read, if data which has been read out of these plural sets coincide, the read-out data of one page is determined to be correct data. In addition, based on a majority of data of the respective sets, the read-out data of one page may be determined to be correct data.

Specifically, as shown in FIG. 18A, one page is divided into, for example, first to fourth sets, and 8-bit data (8 bit) and complementary data (/8 bit: "/" indicates inverted data) of the 8-bit data are stored in each of the four sets. Alternatively, as shown in FIG. 18B, 8-bit data (8 bit) are stored. Of these data, if data of two sets or several sets are correct, the data of this one page may be determined to be correct data.

To be more specific, for example, as shown in FIG. 18A, in the case where 8-bit data (8 bit) and complementary data (/8 bit) of the 8-bit data are stored in each of the sets, when data is read, (1) it is checked whether the data (8 bit), which is read out from the first set, and the complementary data (/8 bit) of this 8-bit data agree or not, for example, by a comparison circuit disposed in the control signal & control voltage generation circuit 7. Specifically, it is checked whether the data (8 bit), which is read out from the first set, and the data, which is obtained by inverting the complementary data (/8 bit), agree or not. As a result, if the data (8 bit) of the first set and the complementary data (/8 bit) agree, (2) it is checked whether the data (8 bit), which is read out from the second set, and the complementary data (/8 bit) of this 8-bit data agree or not. If the data (8 bit) of the second set and the complementary data (/8 bit) agree, (3) it is checked whether the data (8 bit) of the first set and the data of the second set agree or not, and if these data agree, the read-out data of one page is determined to be correct data.

(4) If it is checked whether the data of the first set and the data of the second set agree or not, and if these data do not agree, (5) it is checked whether the data (8 bit), which is read out from the third set, and the complementary data (/8 bit) of this 8-bit data agree or not. In the case where the data of the third set and the complementary data agree, (6) if there are two coincident data among the data of the first set, the data of the second set and the data of the third set, the read-out data of the one page is determined to be correct data. (7) If there are no two coincident data, the data which is read out from the fourth set is used. (8) On the other hand, also in the case where read-out data (8 bit) and complementary data (/8 bit) of this 8-bit data do not agree, the data which is read out of the next set is used.

In addition, for example, as shown in FIG. 18A, although the 8-bit data (8 bit) and the complementary data (/8 bit) of this 8-bit data are stored, if a 1-bit cell of the 8-bit pair has been defective, for example, in the fabrication process, the data of this set do not agree. For example, in the case where data is "00110001" and complementary data is "11001110", if the low-order bit of the data changed to "0" due to a defect in the fabrication process, the written data become data "00110000" and complementary data "11001110". Thus, in a test at a time of shipment, the paired data and complementary data of this set do not agree, and the data of the next pair is selected. If this pair is correct, shipment can be made.

However, after the shipment, if the low-order bit of the complementary data changed, for example, from "0" to "1" ("0"⇒"1") due to retention, etc., the complementary data becomes "11001111". Since the written data is "00110000", the complementary data and the data would agree. However, the originally written data is "00110001", the data is not correct.

In order to prevent such an error after shipment, when data of plural sets are compared in a test step, data and complementary data are set in the test step so that complementarity of all bits of a pair, in which data and complementary data do not agree, may not coincide. For example, data is written as "00000000", and complementary data is also written as "00000000". By setting these data, when the same comparison as described above is executed, all bits do not coincide. Thus, after shipment, even if several bits have changed due to data retention, etc., the possibility of agreement between the data and complementary data lowers. As a result, it is possible to lower the possibility that a defective page is erroneously determined to be a non-defective page.

In addition, as shown in FIG. 18B, the complementary data may be omitted. In this case, at a time of data read, (1) it is checked whether the data of the first set and the data of the second set agree or not. When these data agree, the read-out data is determined to be correct data. (2) If it is checked whether the data of the first set and the data of the second set agree or not and these data do not agree, (3) the read-out data of one page is determined to be correct data if there are two coincident data among the data of the first set, the data of the second set and the data of the third set. (7) If there are no two coincident data, the data which is read out from the fourth set is used.

In the case of FIG. 185, it is possible to write the same data in the first set and the third set, and to write, in the second set and the fourth set, complementary data (/) of the data of the first set and the third set. When agreement of data is checked, the inverted data may always be used as the data of the second set or fourth set.

In this example, it is checked whether the 8-bit data and complementary data of two sets agree or not. However, in order to further enhance reliability, agreement of three sets or more may be confirmed. In addition, the number of bits is not limited to eight, and an arbitrary number of bits, such as 4 bits or 16 bits, may be used.

Furthermore, at a time of a test before shipment, the number of coincident data stored in sets may be made greater than at a time of usual use after shipment, and agreement of three sets or more, or four sets or more, may be confirmed. As a result, by making screening stricter, the possibility of occurrence of a defect after shipment can be reduced.

In the present embodiment, four sets, namely first to fourth sets, are provided, but the number of sets is not limited to this example, and an arbitrary number of sets, such as 8 sets or 16 sets, may be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a memory cell;
    a flag memory cell configured to store a flag, the flag memory cell being configured to be selected at the same time as the memory cell;
    a dummy cell configured to be selected at the same time as the memory cell and the flag memory cell; and
    a controller configured to control write and read of the memory cell, the flag memory cell and the dummy cell,
    wherein the controller is configured to set, by a first write operation, a threshold voltage of the memory cell from a first threshold voltage to the first threshold voltage or a second threshold voltage (first threshold voltage<second threshold voltage),
    the controller is configured to set, by a second write operation, the threshold voltage of the memory cell to the first threshold voltage or a third threshold voltage (first threshold voltage<third threshold voltage) when the threshold voltage of the memory cell is the first threshold voltage, and to set the threshold voltage of the memory cell to a fourth threshold voltage or a fifth threshold voltage (second threshold voltage<=fourth threshold voltage<fifth threshold voltage) when the threshold voltage of the memory cell is the second threshold voltage, and
    the controller is configured to set, at a time of the second write operation, a threshold voltage of the flag memory cell, which is selected at the same time as the memory cell, from the first threshold voltage to the fourth threshold voltage, and to set a threshold voltage of the dummy cell, which neighbors the flag memory cell, from the first threshold voltage to the third threshold voltage.

2. The device according to claim 1, wherein the controller is configured to execute, in a first read operation, a read operation from the memory cell and the flag memory cell with the fourth threshold voltage, to determine, when the threshold voltage of the flag memory cell is the fourth threshold voltage or more, a result which has been read out from the memory cell in the read operation to be read-out data, and to determine, when the threshold voltage of the flag memory cell is less than the fourth threshold voltage, a result which has been read out from the memory cell with the second threshold voltage to be read-out data.

3. The device according to claim 1, wherein the controller is configured to execute, in a second read operation, a read operation from the memory cell and the flag memory cell with the third threshold voltage, to determine, when the threshold voltage of the flag memory cell is the third threshold voltage or more, a result of a read operation from the memory cell with the third threshold voltage and a fifth threshold voltage to be read-out data, and to determine, when the threshold voltage of the flag memory cell is less than the third threshold voltage, a fixed value to be read-out data.

4. The device according to claim 1, wherein after the dummy cell is set at the third threshold voltage, a write voltage is further applied to the dummy cell at least once.

5. The device according to claim 1, wherein the flag memory cell comprises a plurality of flag memory cells, and the flag memory cell is determined to be written, based on a majority of the plurality of flag memory cells or when a predetermined number or more of the flag memory cells are written.

6. The device according to claim 1, wherein after the flag memory cell is set at the fourth threshold voltage, a write voltage is further applied to the flag memory cell at least once.

7. The device according to claim 1, wherein the dummy cell is arranged next to the flag memory cell.

8. The device according to claim 1, wherein the dummy cell is arranged next to the flag memory cell and memory cell.

9. The device according to claim 1, wherein the dummy cell is configured by a plurality of memory cells.

10. A semiconductor memory device comprising:
    a memory cell;
    a flag memory cell configured to store a flag, the flag memory cell being configured to be selected at the same time as the memory cell;
    a dummy cell configured to be selected at the same time as the memory cell and the flag memory cell; and
    a controller configured to control write and read of the memory cell, the flag memory cell and the dummy cell,
    wherein the controller is configured to set, by a first write operation, a threshold voltage of the memory cell from a first threshold voltage to the first threshold voltage or a second threshold voltage (first threshold voltage<second threshold voltage),
    the controller is configured to set, by a second write operation, the threshold voltage of the memory cell to the first threshold voltage or a third threshold voltage (first threshold voltage<third threshold voltage) when the threshold voltage of the memory cell is the first threshold voltage, and to set the threshold voltage of the memory cell to a fourth threshold voltage or a fifth threshold voltage (second threshold voltage<=fourth threshold voltage<fifth threshold voltage) when the threshold voltage of the memory cell is the second threshold voltage, and
    the controller is configured to set, at a time of the second write operation, a threshold voltage of the flag memory cell which is selected at the same time as the memory cell, from the first threshold voltage to the fourth threshold voltage, and to set a threshold voltage of the dummy cell, which neighbors the flag memory cell, from the first threshold voltage to the fourth threshold voltage.

11. The device according to claim 10, wherein the controller is configured to execute, in a first read operation, a read operation from the memory cell and the flag memory cell with the fourth threshold voltage, to determine, when the threshold voltage of the flag memory cell is the fourth threshold voltage or more, a result which has been read out from the memory cell in the read operation to be read-out data, and to determine, when the threshold voltage of the flag memory cell is less than the fourth threshold voltage, a result which has been read out from the memory cell with the second threshold voltage to be read-out data.

12. The device according to claim 10, wherein the controller is configured to execute, in a second read operation, a read operation from the memory cell and the flag memory cell with the third threshold voltage, to determine, when the threshold voltage of the flag memory cell is the third threshold voltage or more, a result of a read operation from the memory cell with the third threshold voltage and a fifth threshold voltage to be read-out data, and to determine, when the threshold voltage of the flag memory cell is less than the third threshold voltage, a fixed value to be read-out data.

13. The device according to claim 10, wherein after the dummy cell is set at the fourth threshold voltage, a write voltage is further applied to the dummy cell at least once.

14. The device according to claim 10, wherein the flag memory cell comprises a plurality of flag memory cells, and the flag memory cell is determined to be written, based on a majority of the plurality of flag memory cells or when a predetermined number or more of the flag memory cells are written.

15. The device according to claim 10, wherein after the flag memory cell is set at the fourth threshold voltage, a write voltage is further applied to the flag memory cell at least once.

16. The device according to claim 10, wherein the dummy cell is arranged next to the flag memory cell.

17. The device according to claim 10, wherein the dummy cell is arranged next to the flag memory cell and memory cell.

18. The device according to claim 10, wherein the dummy cell is configured by a plurality of memory cells.

* * * * *